(12) United States Patent
McCaughan et al.

(10) Patent No.: US 10,171,086 B2
(45) Date of Patent: *Jan. 1, 2019

(54) SUPERCONDUCTING THREE-TERMINAL DEVICE AND LOGIC GATES

(71) Applicant: Massachusetts Institute of Technology, Cambridge, MA (US)

(72) Inventors: Adam N. McCaughan, Cambridge, MA (US); Karl K. Berggren, Arlington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 348 days.

This patent is subject to a terminal disclaimer.

(21) Appl. No.: 14/775,118

(22) PCT Filed: Mar. 11, 2014

(86) PCT No.: PCT/US2014/023640
§ 371 (c)(1),
(2) Date: Sep. 11, 2015

(87) PCT Pub. No.: WO2014/197047
PCT Pub. Date: Dec. 11, 2014

(65) Prior Publication Data
US 2016/0028402 A1    Jan. 28, 2016

Related U.S. Application Data

(60) Provisional application No. 61/842,907, filed on Jul. 3, 2013, provisional application No. 61/776,068, filed on Mar. 11, 2013.

(51) Int. Cl.
*H03K 19/195* (2006.01)
*H03K 19/20* (2006.01)
(Continued)

(52) U.S. Cl.
CPC ......... *H03K 19/195* (2013.01); *H01L 39/025* (2013.01); *H01L 39/10* (2013.01);
(Continued)

(58) Field of Classification Search
CPC ... H01L 29/437; H01L 39/16; H01L 39/2403; H01L 39/025; H01L 39/045; H01L 39/22;
(Continued)

(56) References Cited

U.S. PATENT DOCUMENTS 2,832,897 A    4/1958 Buck
4,334,158 A    6/1982 Faris
(Continued)

OTHER PUBLICATIONS

International Search Report and Written Opinion for Application No. PCT/US2014/023640 dated Nov. 20, 2014.
(Continued)

*Primary Examiner* — Vibol Tan
(74) *Attorney, Agent, or Firm* — Wolf, Greenfield & Sacks, P.C.

(57) ABSTRACT

A three-terminal device that exhibits transistor-like functionality at cryogenic temperatures may be formed from a single layer of superconducting material. A main current-carrying channel of the device may be toggled between superconducting and normal conduction states by applying a control signal to a control terminal of the device. Critical-current suppression and device geometry are used to propagate a normal-conduction hotspot from a gate constriction across and along a portion of the main current-carrying channel. The three-terminal device may be used in various superconducting signal-processing circuitry.

25 Claims, 19 Drawing Sheets

(51) Int. Cl.
  *H01L 39/10* (2006.01)
  *H01L 39/14* (2006.01)
  *H01L 39/02* (2006.01)
  *H01L 39/12* (2006.01)

(52) U.S. Cl.
  CPC ............ *H01L 39/12* (2013.01); *H01L 39/125* (2013.01); *H01L 39/126* (2013.01); *H01L 39/145* (2013.01); *H03K 19/20* (2013.01)

(58) Field of Classification Search
  CPC . H01L 39/223; H01L 39/2493; H01L 39/145; H01L 39/126; H01L 39/125; H01L 39/25; H01L 39/10; H01L 39/12; H03K 17/92; H03K 19/195; H03K 23/763; H03K 19/00; H03K 19/20; Y10T 29/49014; Y10T 74/2119; G06F 7/381; Y10S 505/00; Y10S 505/706; Y10S 505/817; Y10S 505/832; Y10S 505/864; Y10S 505/865; Y10S 505/846; Y10S 505/874; G01R 33/0358; G01R 33/326; H03M 13/6575
  See application file for complete search history.

(56) References Cited

U.S. PATENT DOCUMENTS

| | | | |
|---|---|---|---|
| 4,371,796 A | | 2/1983 | Takada |
| 4,496,854 A | | 1/1985 | Chi et al. |
| 4,526,858 A | * | 7/1985 | Lukens ................... B82Y 10/00 257/E39.014 |
| 5,051,627 A | | 9/1991 | Schneier et al. |
| 5,455,519 A | | 10/1995 | Ohori |
| 5,481,119 A | | 1/1996 | Higashino et al. |
| 5,831,278 A | | 11/1998 | Berkowitz |
| 6,154,044 A | | 11/2000 | Herr |
| 6,310,488 B1 | | 10/2001 | Hasegawa et al. |
| 6,710,343 B2 | | 3/2004 | Wood et al. |
| 6,734,699 B1 | | 5/2004 | Herr et al. |
| 7,468,630 B2 | | 2/2008 | Inamdar et al. |
| 7,365,271 B2 | * | 4/2008 | Knoll ................... H01L 39/143 174/125.1 |
| 7,786,748 B1 | | 8/2010 | Herr |
| 7,879,763 B2 | * | 2/2011 | Selvamanickam ... H01L 39/143 428/930 |
| 8,571,614 B1 | | 10/2013 | Mukhanov et al. |
| 9,509,315 B2 | * | 11/2016 | McCaughan ........... H01L 39/10 |
| 9,747,968 B2 | * | 8/2017 | Ohki .................... G11C 11/1675 |
| 9,887,000 B1 | * | 2/2018 | Mukhanov .............. G11C 11/44 |

OTHER PUBLICATIONS

International Preliminary Report on Patentability for Application No. PCT/US2014/023640 dated Sep. 24, 2015.
International Search Report and Written Opinion for Application No. PCT/US2014/023664 dated Nov. 20, 2014.
International Preliminary Report on Patentability for Application No. PCT/US2014/023664 dated Sep. 24, 2015.
Annunziata et al., Reset dynamics and latching in niobium superconducting nanowire single-photon detectors. J Appl Phys. 2010;108(8):084507(1-7).
Annunziata, Single-Photon Detection, Kinetic Inductance, and Non-Equilibrium Dynamics in Niobium and Niobium Nitride Superconducting Nanowires. Yale PhD Thesis. May 2010. http://proberlab.yale.edu/sites/default/files/files/Annunziata_Thesis.pdf. 224 pages.
Doda et al., Characteristics of superconducting flux flow transistors under irradiation of femtosecond laser pulses. Physica C. 2003;392-396:1504-08.
Hohenwarter, Superconducting high TC thin film vortex-flow transistor. Research Report. AD-A235 025. Aug. 1, 1990 to Mar. 31, 1999.available online at www.dtic.mil/dtic/tr/fulltext/u2/a235025.pdf. 29 pages.
Hosoya et al., quantum flux parametron: A single quantum flux device for Josephson supercomputer. IEEE Trans Appl Supercond. Jun. 1991;1(2):77-89.
Kerman et al., Electrothermal feedback in superconducting nanowire single-photon detectors. Phys Rev B. 2009;79:100509R(1-4).
Ko et al., Characteristics of a single-channel superconducting flux flow transistor fabricated by an AFM modification technique. Physica C. 2007;466:16-22.
Marsili et al., Detecting single infrared photons with 93% system efficiency. Nat Photonics. Mar. 2013;7:210-14. Epub Feb. 24, 2013.
Matisoo, The tunneling cryotron—A superconductive logic element based on electron tunneling. Proc. IEEE. Feb. 1967;55(2):172-80.
Morpugo et al., Hot electron tunable supercurrent. Appl Phys Lett. Feb. 23, 1998; 72(8):966-8.
Najafi et al., Timing performance of 30-nm-wide superconducting nanowire avalanche photodetectors. Appl Phys Lett. 2012;100:152602(1-4). Suppl Mater. 5 pages.
Pagano et al., Nano-strip three-terminal superconducting device for cryogenic detector readout. IEEE Trans on Appl Supercond. Jun. 2011; 21(3):717-20.
Prober, Superconducting terahertz mixer using a transition-edge microbolometer. Appl Phys Lett. Apr. 26, 1993;62(17):2119-21.
Quaranta et al., Superconductive three-terminal amplifier/discriminator. IEEE Trans Appl Supercond. Jun. 2009;19(3):367-70.
Rothwarf et al., Measurement of recombination lifetimes in superconductors. Phys Rev Lett. Jul. 1967;19(1):27-30.
Semenov et al., Analysis of the nonequilibrium photoresponse of superconducting films to pulsed radiation by use of a two-temperature model. Phys Rev B. Jul. 1, 1995;52(1):581-90.
Semenov et al., Quantum detection by current carrying superconducting film. Phys C: Supercond. Apr. 15, 2001;351(4):349-56.
Skocpol et al., Self-heating hotspots in superconducting thin-film microbridges. J Appl Phys. Sep. 1974;45(9):4054-66.
Yang et al., Modeling the electrical and thermal response of superconducting nanowire single-photon detectors. IEEE Trans on Appl Supercond. Jun. 2007;17(2):581-5.
Akazaki et al., A Josephson field effect transistor using an InAs-inserted-channel $In_{0.52}Al_{0.48}As/In_{0.53}Ga_{0.47}As$ inverted modulation-doped structure. Appl Phys Lett. Jan. 15, 1996;68(3):418-20.
Buck, The cryotron—A superconductive computer component. Proc IRE. Apr. 1956;44:482-93.
Clem et al., Geometry-dependent critical currents in superconducting nanocircuits. Phys Rev B. Nov. 2011;84(17):174510 (1-27).
Ejrnaes et al., Characterization of superconducting pulse discriminators based on parallel NbN nanostriplines. Supercond Sci Technol. Jan. 20, 2011;24(3):035018(1-6).
Gray, A superconducting transistor. Appl Phys Lett. Mar. 15, 1978;32(6):392-5. doi.10/1063/1.90066.
Gurevich et al., Self-heating in normal metals and superconductors. Rev Mod Phys. Oct. 1987;59(4):941-99.
Hortensius et al., Critical-current reduction in thin superconducting wires due to current crowding. Appl. Phys Lett. 2012;100:182602(1-4). Epub May 3, 2012.
Klapwijk, Proximity effect from an Andreev perspective. J Supercond: Incorp Novel Magnetism. Oct. 2004;17(5):593-611.
Kurter et al., Microscopic examination of hot spots giving rise to nonlinearity in superconducting resonators. Phys. Rev. B. Sep. 12, 2011;84(10):104515(1-5).
Lee et al., Superconducting nanotransistor based digital logic gates. Nanotechnology. Feb. 2003;14(2):188-91. Epub Jan. 16, 2003.
Likharev, Superconductor digital electronics. Physica C. Nov. 20, 2012;482:6-18. Epub Jun. 15, 2012.
Pagano et al., Josephson junctions. Supercond Sci Technol. Dec. 1997;10(12):904-8.
Peterson et al., Self-heating hotspot effects in HTS thin films. IEEE Trans Appl Supercond. 1995;5(2):1436-9. Epub Jun. 1, 1995.
U.S. Appl. No. 14/775,172, filed Sep. 11, 2015, McCaughan et al.
PCT/US2014/023640, Nov. 20, 2014, International Search Report and Written Opinion.
PCT/US2014/023640, Sep. 24, 2015, International Preliminary Report on Patentability.
PCT/US2014/023664, Nov. 20, 2014, International Search Report and Written Opinion.

(56) References Cited

OTHER PUBLICATIONS

PCT/US2014/023664, Sep. 24, 2015, International Preliminary Report on Patentability.

* cited by examiner

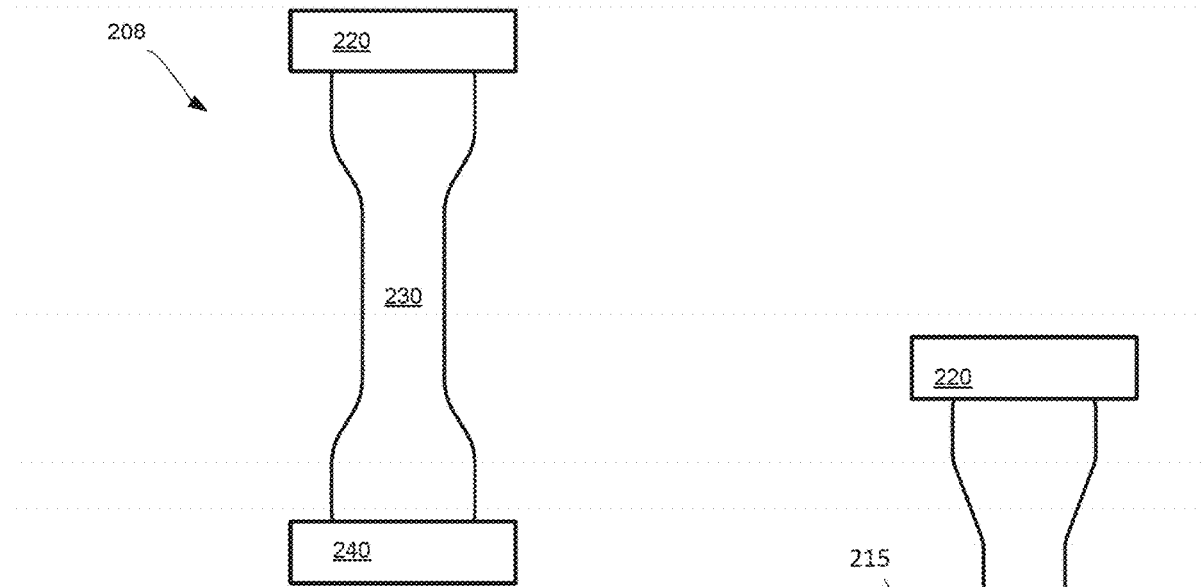
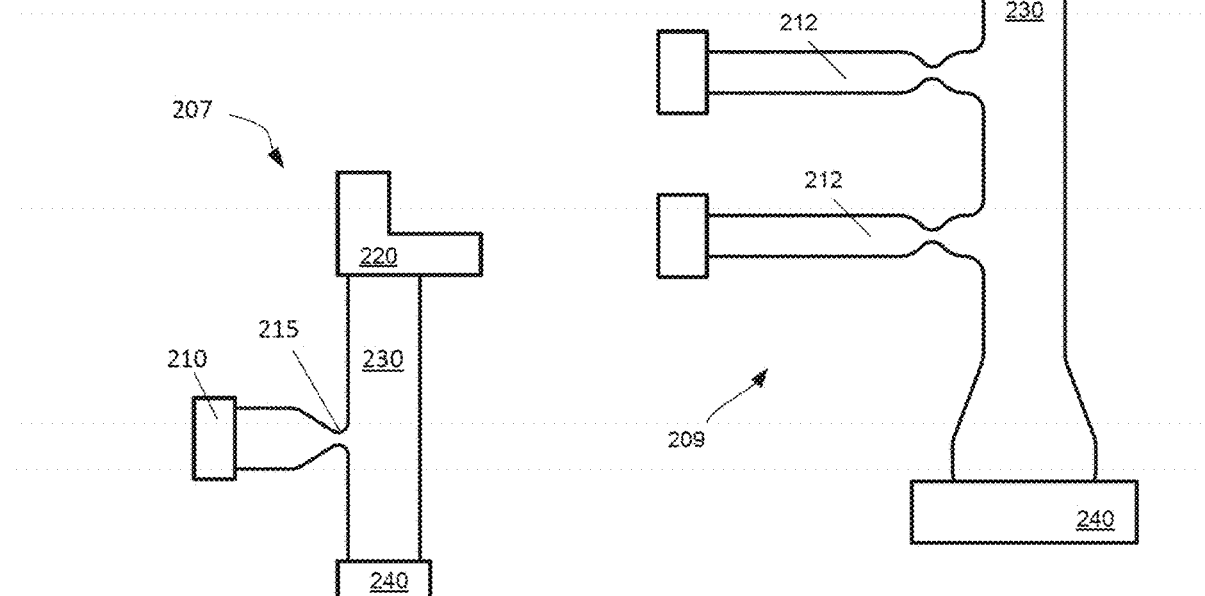

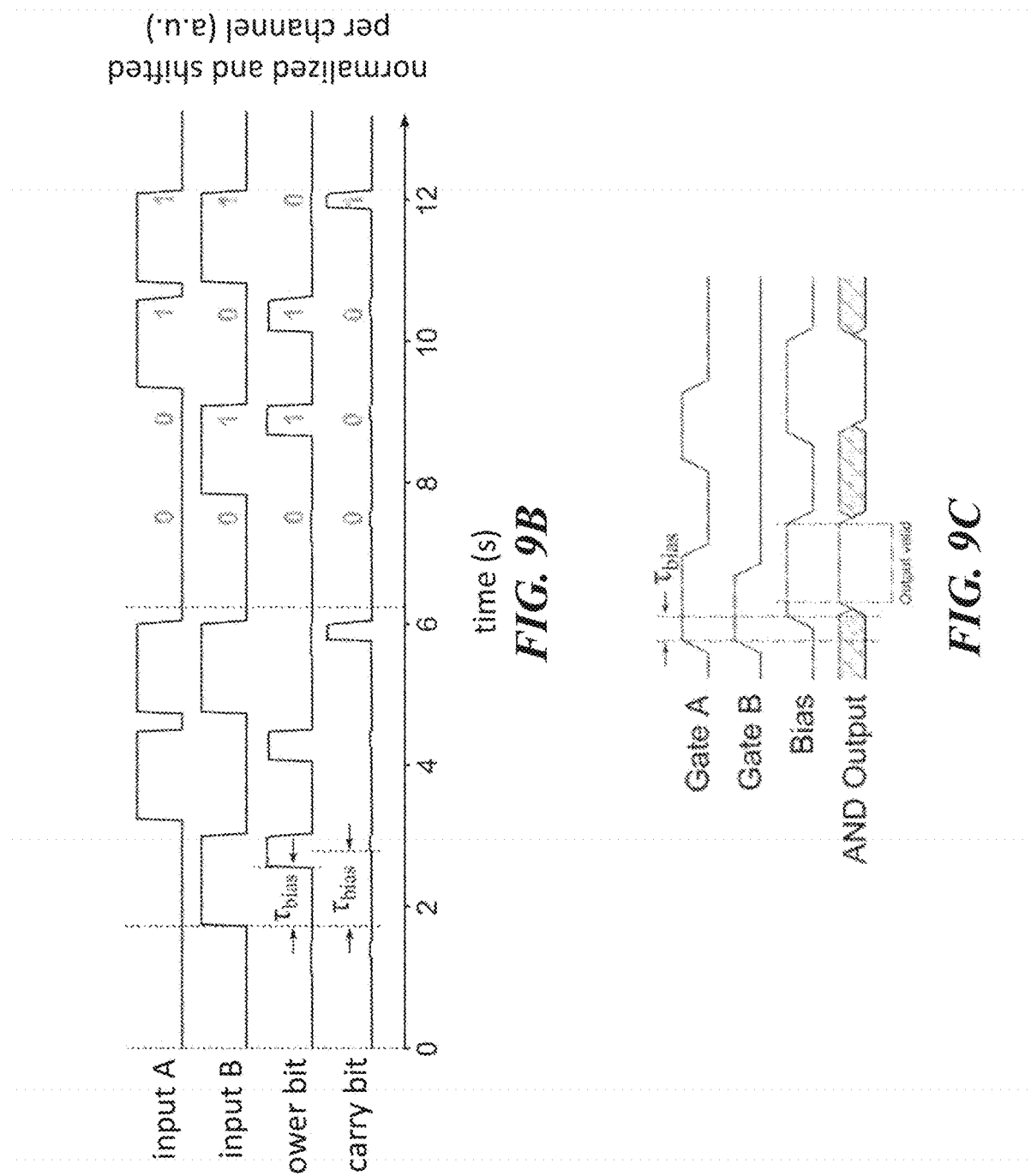

SUPERCONDUCTING THREE-TERMINAL DEVICE AND LOGIC GATES

RELATED APPLICATIONS

This application is a national stage filing under 35 U.S.C. § 371 of International Application Number PCT/US2014/023640, filed March 11, 2014, entitled "SUPERCONDUCTING THREE-TERMINAL DEVICE AND LOGIC GATES", which claims priority under 35 U.S.C. § 119(e) to U.S. Provisional Patent Application Serial No. 61/776,068, filed Mar. 11, 2013, entitled "SUPER CONDUCTING NANOWIRE LOGIC" and to U.S. Provisional Patent Application Serial No. 61/842,907, filed Jul. 3, 2013, entitled "SUPER CONDUCTING NANOWIRE LOGIC", each of which is incorporated herein by reference in its entirety for all purposes.

GOVERNMENT SPONSORSHIP

This invention was made with Government support under Grant No. ECCS-1128222 awarded by the National Science Foundation. The Government has certain rights in the invention.

FIELD

The technology relates to integrated, superconducting, three-terminal devices that operate like transistors and to related circuit elements including logic.

BACKGROUND

Superconducting switches for various electrical circuit applications have been studied, and several different devices have been developed. Some superconducting switches, such as the cryotron developed by Dudley Buck in the 1950's and the superconducting flux-flow transistor (SFFT) developed in more recent years, rely on an externally-applied magnetic field to quench superconductivity between current-carrying terminals of the device. (See e.g., U.S. Pat. No. 2,832,897; G. K. Hohenwarter, "Superconducting High TC Thin Film Vortex-Flow Transistor," Sponsored Research Report (1991) available at www.dtic.mil/dtic/tr/fulltext/u2/a235025.pdf.) Because these devices switched a large region of the device between a "superconducting" state and a "normal" state, the devices tend to exhibit slow switching speeds, e.g., on the order of 10's of microseconds.

In the late 1960's, alternative approaches to fabricating superconducting switches incorporated Josephson junctions into a multi-layer integrated device. (See e.g., J. Matisoo, "The Tunneling Cryotron—A Superconductive Logic Element Based on Electron Tunneling," *Proc. IEEE*, Vol. 55, No. 2, February 1967, p. 172.) The Josephson junction devices include a tunnel junction at a gate region of the device. Tunneling current through the junction can be switched between a superconducting state and a normal tunneling state by the application of a current pulse that exceeds a critical current level at the Josephson junction. Because the junction volume is small, the device can be switched quickly, e.g., at switching times approaching 10 picoseconds. However, Josephson-junction-based devices have a number of limitations including: (1) sensitivity to magnetic fields, (2) limited gain, (3) inability to drive large impedances, and (4) difficulty in manufacturing control of the junction critical current (which depends sensitively on sub-Angstrom-scale thickness variation of the tunneling barrier). Additionally, fabrication of the device requires multi-layer and multi-material processing, as well as precise control of the tunneling barrier's thickness.

Recently, superconducting sensors and amplifiers have been developed for applications such as single-photon detection. (See, O. Quaranta et al., "Superconductive Three-Terminal Amplifier/Discriminator," *IEEE Trans. Appl. Supercond.*, Vol. 19, No. 3 (2009) p. 367.) An example of superconducting pulse amplifier 100 described in this work is depicted in FIG. 1. The device comprises an input terminal 102 and two main terminals 104, 106. Current $I_{C_{in}}$ flowing into a main input terminal 104 may flow across parallel channels 110, 112 to a main output terminal 106. There may be more than two parallel channels. The input terminal 102 connects to one of the parallel channels at a T-shaped junction 120. In operation, the current in each of the parallel channels is biased close to a "critical current" value $I_{crit}$ for each channel. The critical current value is a value of current above which superconductivity in the channel cannot be supported.

In operation, receipt of a signal pulse at the input terminal 102 with a peak current value $I_p$ adds current to the current $I_{C_1}$ flowing in the first channel 110. Since the first channel 110 is biased near its critical current level, the resulting current in the first channel then exceeds the critical current for the first channel: $(I_p + I_{C_1}) > I_{crit1}$. Because of the excess current, superconductivity is no longer supported by the first channel, so that current from that channel is diverted to the second channel 112, where the critical current in that channel is also exceeded. As a result, superconductivity is quenched in the device's channels and a voltage across the main terminals 104, 106 increases from a zero value. Depending upon the device's internal resistances and external resistances connected to the device 100, the input pulse signal can produce an amplified pulse signal as measured across the main terminals 104, 106.

SUMMARY

Embodiments of an integrated three-terminal, superconducting, planar device with transistor-like functionality are described. The three-terminal devices are capable of switching currents in a main current-carrying channel between ON and OFF states by application of a control signal to a "gate" terminal of the device. The switched current may be appreciably larger than the current applied to the control terminal, and current flowing in the main current-carrying channel prior to switching can be as low as about 50% of the main channel's critical current in some embodiments. The switching functionality does not rely on Josephson junctions, and therefore, the device does not exhibit as significant sensitivity to fabrication and has greater immunity to magnetic fields, aspects which can be problematic in conventional Josephson-junction devices.

According to some embodiments, a three-terminal device may be patterned from a single, contiguous layer of material, may be capable of driving low impedances (e.g., ~50 ohms) as well as impedances ranging up to about 200 kΩ. The three-terminal devices may operate at temperatures of about 4.2K in typical ambient magnetic fields. Current gains values up to about 20 with improved noise immunity may be achieved in some embodiments. According to some embodiments, the devices are suitable for amplifying signals, operating as a digital comparator (i.e. amplification of a digital signal), and/or logic functionality (including signal-processing operations) at cryogenic temperatures.

In some embodiments, a three-terminal device comprises a main channel connecting a first terminal and a second terminal, a gate channel connecting a control terminal to the main channel, and a low-resistance constriction formed in the gate channel between the control terminal and the main channel, wherein the constriction is configured to increase a gate current density proximal to the main channel. In some implementations, the low-resistance constriction comprises a narrowing of the gate channel, wherein the constriction is formed from the same material as the gate channel. In some implementations, the resistance of the constriction is less than 50 ohms.

Embodiments also include a multi-input OR gate comprising a main channel connecting a first terminal and a second terminal, at least two gate channels connecting at least two control terminals to the main channel, and at least two low-resistance constrictions formed in the at least two gate channels between the at least two control terminals and the main channel, wherein each constriction is configured to increase a gate current density proximal to the main channel.

According to some aspects, the main channel, gate channel, and constriction are patterned from a single layer of superconducting material. In some implementations, the superconducting material comprises NbN, YBaCuO, HgTlBaCaCuO, $MgB_2$, BISCCO, Nb, NbTiN, NbCN, Al, AlN, WSi, Ga, In, Sn, Pb, or MoGe. In some aspects, the constriction is located within approximately 200 nm of an edge of the main channel. In some implementations, the main channel further comprises a narrowed portion extending for a length along the main channel and an intersection of the gate channel with the main channel occurs within the length of the narrowed portion. In some aspects, the intersection of the gate channel with the main channel is located within a downstream half of the length of the narrowed portion.

In some implementations, the constriction is located within approximately two diffusion lengths of a far edge of the main channel at an intersection with the gate channel, wherein one diffusion length $L_D$ is given by the following expression $$L_D = \sqrt{D_e \tau_r}$$

where $D_e$ is the diffusion constant for electrons in a superconducting material from which the gate channel is formed and $\tau_r$ is the recombination time for hot electrons in the superconducting material in a superconducting state.

According to some implementations, the main channel further comprises a narrowed portion extending for a length along the main channel and an intersection of the gate channel with the main channel occurs within the length of the narrowed portion and wherein a width of the narrowed portion is less than approximately three diffusion lengths, wherein one diffusion length $L_D$ is given by the following expression $$L_D = \sqrt{D_e \tau_r}$$

where $D_e$ is the diffusion constant for electrons in a superconducting material from which the gate channel is formed and $\tau_r$ is the recombination time for hot electrons in the superconducting material in a superconducting state.

In some aspects, a three-terminal device may further comprise periodic width modulations of the main channel located near a junction of the gate channel with the main channel.

According to some implementations, a three-terminal device may further comprise an output terminal connected to the first terminal, and a resistor connected in series with the output terminal. A resistance of the resistor may be any value up to 200,000 ohms. In some implementations, the three-terminal device may further comprise a current bias source connected to the first terminal.

In some implementations, a three-terminal device may further comprise a sensor connected to the control terminal, wherein the sensor is arranged to provide a signal representative of a sensed physical parameter to the control terminal. In some implementations, the sensor comprises a superconducting single-photon detector. In some aspects, the sensor comprises a radio frequency, microwave, or terahertz sensor.

According to some aspects, a three-terminal device may be arranged in a circuit with a SQUID having an output terminal of the SQUID connected to the control terminal. In some implementations, a three-terminal device may be connected in a circuit comprising an RSFQ system, wherein the three-terminal device is configured to receive a signal from the RSFQ system.

Any of the foregoing aspects and implementations may be combined in any suitable manner for one or more embodiments of a three-terminal device.

Methods of operating superconducting, three-terminal devices are also contemplated. According to some embodiments, a method of operating a three-terminal device fabricated from a superconducting material may comprise acts of placing the three-terminal device in a superconducting state, such that a main channel between a first terminal and a second terminal is superconducting, applying a control signal to a constriction in a gate channel that connects a control input to the main channel, such that current at the constriction exceeds a superconducting critical current level at the constriction.

In some aspects, a method may further comprise propagating a normal-conduction hotspot that suppresses a superconducting critical current value from the constriction to the main channel. A method may further include diverting current from the main channel to an output terminal that is connected to the first terminal. In some implementations, a method includes driving a load connected to the output terminal, wherein the load has a resistance value up to 200,000 Ohmns. According to some implementations, a method includes forming a stable resistive plug in the main channel. The hotspot is may be propagated to a narrowed portion of the main channel, wherein the narrowed portion extends a length along the main channel.

According to some implementations, a method of operating a three-terminal device may further comprise applying a bias current to the main channel, and receiving an output signal from the first terminal. In some implementations, the method comprises driving a resistive load of up to 200,000 ohms with the output signal. A method of operating a three-terminal device may further comprise receiving the control signal from a sensor that is connected to the gate channel.

The foregoing aspects and implementations of acts may be combined in any suitable manner in one or more embodiments of a method of operating a three-terminal device. Any suitable embodiment of a method of operating a three-terminal device may be implemented on any of the above-described embodiments of three-terminal devices.

Additional arrangements of superconducting devices are also contemplated. In some embodiments, a dynamically programmable AND/OR logic gate may be formed from two, three-terminal devices. A dynamically programmable AND/OR logic gate may comprise two, three-terminal devices connected in parallel between a current bias source and a reference potential. Each three-terminal device may comprise a main current-carrying channel configured to be connected between the current bias source and the reference potential, a gate channel configured to receive a logic input signal and connected to the main current-carrying channel, and a low-resistance constriction formed in the gate channel proximal the main channel. The constriction may be configured to increase a gate current density proximal the main channel. In some implementations, the low-resistance constriction comprises a narrowing of the gate channel, wherein the constriction is formed from the same material as the gate channel. In some implementations, the resistance of the constriction is less than 50 ohms.

According to some embodiments, a dynamically programmable AND/OR logic gate may comprise a main current-carrying channel configured to be connected between a current bias source and a reference potential. The AND/OR gate may further comprise a first gate channel configured to receive a first logic input signal, wherein the first gate channel is connected to a first side of the main current-carrying channel, and a low-resistance first constriction formed in the first gate channel proximal the main channel. The AND/OR gate may further comprise a second gate channel configured to receive a second logic input signal, wherein the second gate channel is connected to the main current-carrying channel at a side opposite the first gate channel. In various embodiments, the first and second constrictions are configured to increase a gate current density at the constrictions in each gate channel.

According to some aspects, both three-terminal devices are patterned from a single layer of superconducting material. In some implementations, AND logic functionality is obtained by applying a first bias current from the current bias source and OR functionality is obtained by applying a second bias current from the current bias source. In some implementations, the first bias current is less than the second bias current.

In some aspects, each constriction in each gate channel is of substantially the same size and each main channel is of substantially the same size. In some implementations, an AND/OR logic gate may further comprise an output terminal connected between the current bias source and the main current carrying channels, and a resistive load connected in series with the output terminal. In some aspects, a resistance of the resistive load may be any value up to approximately 200,000 ohms.

The foregoing aspects and implementations of a dynamically programmable AND/OR gate and aspects and implementations of superconducting, three terminal devices described above may be combined in any suitable manner to form one or more embodiments of a dynamically programmable AND/OR gate.

Methods of operating dynamically programmable AND/OR logic gates are also contemplated. According to some embodiments, a method of operating a dynamically programmable AND/OR logic gate may comprise applying a first bias current to two main current carrying channels of two superconducting, three-terminal devices connected in parallel in the programmable AND/OR logic gate, and operating the AND/OR logic gate as an AND gate during application of the first bias current. A method may further comprise applying a second bias current to the two main current carrying channels, and operating the AND/OR logic gate as an OR gate during application of the second bias current. According to some aspects, the first bias current is less than the second bias current.

In some implementations, a method may further comprise receiving digital signals at gate channels of the two superconducting, three-terminal devices and providing an output digital signal from the AND/OR logic gate. In some aspects, the gate channels each comprise a low-resistance constriction formed in the gate channel proximal a respective main channel, wherein the constriction is configured to increase a gate current density at the constriction. In some implementations, each constriction is located within approximately 200 nm of an edge of the respective main channel. In some aspects, each constriction is located within approximately two diffusion lengths of a far edge of a respective main channel at an intersection with the gate channel, wherein one diffusion length $L_D$ is given by the following expression $$L_D = \sqrt{D_e \tau_r}$$

where $D_e$ is the diffusion constant for electrons in a superconducting material from which the gate channel is formed and $\tau_r$ is the recombination time for hot electrons in the superconducting material in a superconducting state.

According to some aspects, the two superconducting, three-terminal devices are patterned from a single layer of superconducting material. A method for operating a dynamically programmable AND/OR logic gate may comprise placing the AND/OR logic gate in a superconducting state. In some aspects, the superconducting material comprises NbN, YBaCuO, HgTlBaCaCuO, $MgB_2$, BISCCO, Nb, NbTiN, NbCN, Al, AlN, WSi, Ga, In, Sn, Pb, or MoGe.

In some embodiments, a logic inverter may be formed from at least one superconducting, three-terminal device. A logic inverter may comprise a first three-terminal device comprising a first main current-carrying channel connected between a current bias source and a main current-carrying terminal of a second superconducting device. The inverter may further comprise a first gate channel of the first three-terminal device configured to receive a logic input signal and connected to the first main current-carrying channel, and a constriction formed in the first gate channel proximal to the first main current-carrying channel. The inverter may further include a logic output terminal connected between the first three-terminal device and the second superconducting device.

In some aspects, the first three-terminal device and the second superconducting device are formed from superconducting material. In some implementations, the first three-terminal device and the second superconducting device are formed from a single layer of superconducting material.

The foregoing aspects and implementations of an inverter and aspects and implementations of a superconducting, three terminal device may be combined in any suitable manner to form one or more embodiments of a logic inverter.

The foregoing and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the invention may be shown exaggerated or enlarged to facilitate an understanding of the invention. In the drawings, like reference characters generally refer to like features, functionally similar and/or structurally similar elements throughout the various figures. The drawings are not necessarily to scale, emphasis instead being placed upon illustrating the principles of the teachings. The drawings are not intended to limit the scope of the present teachings in any way.

FIG. 2H depicts a superconducting, two-terminal device, according to some embodiments;

FIG. 2I depicts a multi-input OR gate, according to some embodiments;

FIG. 2J depicts a superconducting, three-terminal device with a main channel having a substantially uniform width, according to some embodiments;

FIGS. 9A-9B depict an implementation of an adder circuit and logic test signals for the circuit, according to some embodiments;

FIG. 9C depicts logic signals for an AND gate, according to some embodiments;

FIGS. 10A-10B depict a detection circuit that includes a superconducting, three-terminal device arranged as an amplifier for a single-photon detector, according to some embodiments;

Figure 1:
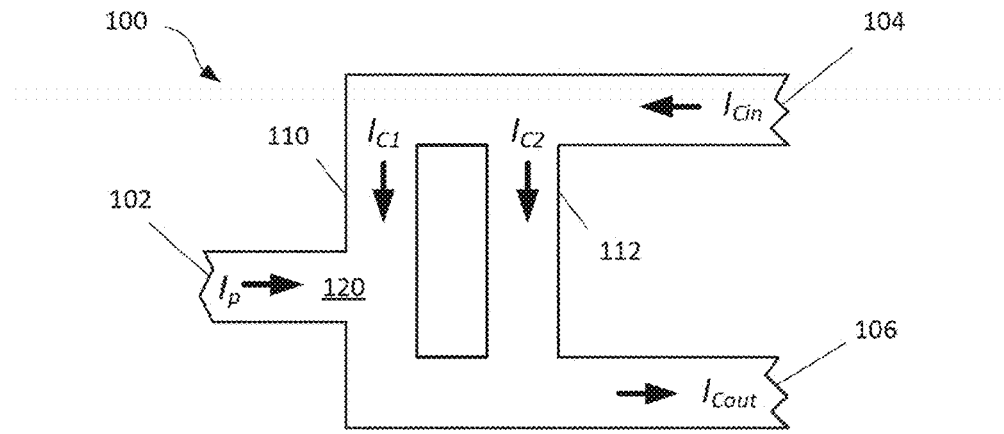
FIG. 1 depicts a known superconducting amplifier.

The features and advantages of the present invention will become more apparent from the detailed description set forth below when taken in conjunction with the drawings.

DETAILED DESCRIPTION

I. Introduction

Many cryogenic experiments involve the generation and manipulation of electrical signals, often with very low amplitudes. Processing of these signals is difficult, since conventional solid-state electronics experience carrier freeze out and do not function at cryogenic temperatures. Very few signal-processing options are available at temperatures below 10 K. Although rapid single flux quantum (RSFQ) systems may be employed to process signals at cryogenic temperatures, implementing RSFQ logic requires fabrication of Josephson junctions. Logic devices based on Josephson junctions may work suitably for some materials, but exhibit unreliable performance for high-$T_c$ superconducting materials. Part of the difficulty with Joshephson junction devices lies in forming uniform, nanometer-scale tunnel barriers consistently across a plurality of devices that may be used in an RSFQ system.

To avoid complexities and difficulties associated with RSFQ systems and Josephson junction devices, signals generated at cryogenic temperatures may be carried to room temperature, and then processed. However, the transition to room temperature can add noise (e.g., Johnson noise, as well as shot noise from thermal electrons) to signals generated at cryogenic temperatures. In some cases for very low-level signals, the added noise may be equivalent to, or greater than, the original signal level, and signal detection may be poor and/or signal error rates may become unacceptably high.

II. Superconducting, Three-Terminal Devices

Described herein are planar, microfabricated, superconducting, three-terminal devices that exhibit transistor-like functionality. An embodiment of a three-terminal device 200 is depicted in FIG. 2A. According to the present embodiments, a three-terminal device can be fabricated from a single layer of superconducting material, and unlike Josephson-junction devices, does not require a tunneling barrier and can be readily fabricated using high-$T_c$ materials. Three-terminal devices may be used to implement logic and signal-processing circuitry at cryogenic temperatures, in some embodiments. For example, comparators, inverters, buffers, line drivers, AND, and OR gates may be constructed from one or more three-terminal devices. Additionally, a three-terminal device can exhibit high gain and improved noise immunity over a prior cryogenic amplifier depicted in FIG. 1, according to some implementations.

According to some embodiments, a superconducting, three-terminal device 200 may be formed from a single layer of superconducting material 201, as depicted in FIG. 2A. In various embodiments, the device may comprise a gate channel 212 that connects to a main channel 222, both formed from the single layer of superconducting material. The device may further comprise a gate or control terminal 210, and two main terminals 220, 240. The gate terminal 210 may connect to the gate channel 212, and the two main terminals 220, 240 may connect to the main channel 222. The terminals may, or may not, be formed of superconducting material, and may provide external connection points for the device. In some embodiments, the terminals may be formed of the same superconducting material as used to form the gate and main channels (e.g., formed as extensions of the channels and/or as pads at ends of the channels). The gate channel 212 may connect to the main channel 222 in a "T" configuration, though other configurations may be used. In various embodiments, the main channel carries a majority of electrical current in the device, and current in the main channel can be controlled or switched by a signal applied to the gate channel.

In some embodiments, a three-terminal device 200 may include a patterned superconducting nanowire or nanostrip 215 within the gate channel 212, and located near the main channel 222. The nanostrip may comprise line-narrowing geometries, and may have low thermal dissipation to the surrounding environment (e.g., to air or material adjacent the gate channel), in some implementations. In other embodiments, the nanostrip may have higher thermal conductivity to an adjacent material so as to improve heat dissipation and increase device speed. The nanostrip may be referred to as a "choke" or "constriction" herein. According to some embodiments, the choke 215 is proximal an intersection of the gated channel 212 with the main channel 222 and located between the main terminals 220, 240.

The device's main channel 222 may be any length and its width W may be between approximately 50 nm and approximately 1 micron in some embodiments, between approximately 50 nm and approximately 500 nm in some embodiments, and yet between approximately 50 nm and approximately 250 nm in some embodiments. In some embodiments, three-terminal devices may be designed to handle high currents, and may have main channel widths $W_{cn}$ that are greater than 1 micron and even up to a millimeter or more. The main channel 222 may include a narrowed section 230 (which may be referred to as a "trunk" herein) that is located near the choke 215. The trunk region 230 may narrow the channel width by a multiplying factor between approximately 0.2 and approximately 0.95, according to some embodiments. In some embodiments, the trunk region 230 may not narrow the channel, and the channel may be of substantially a uniform width.

In various embodiments, the gate channel 212 connects to the main channel 222 at a location along the trunk 230. In some embodiments, the gate channel 212 intersects the trunk at a downstream portion of the trunk, e.g., in a downstream half of the trunk, as depicted in FIG. 2A. The term "downstream" is used with reference to the direction of current flow in the main channel 222. The gate intersection may be located within a last 50% of the trunk's downstream region in some embodiments, within a last 30% of the trunk's downstream region in some embodiments, within a last 20% of the trunk's downstream region in some embodiments, and yet within a last 10% of the trunk's downstream region in some embodiments. According to some embodiments, the three-terminal device can be operated with a reverse current flow in the main channel, though the device's gain may differ from that for a forward current flow in the main channel. In some implementations, a device designed for forward and reverse current flow may have its gate channel 212 located approximately in the middle of the trunk region 230.

In various embodiments, the choke 215 may be located proximal to the main channel 222. In this context, "proximal" means within a perpendicular distance from a near edge of the main channel, wherein that distance is less than approximately a width W of the main channel. In various embodiments, the choke is formed of the same material as the gate channel and main channel. The choke 215 may be formed in the gate channel within approximately 300 nm of the trunk region according to some embodiments, within approximately 200 nm of the trunk region according to some embodiments, and yet within approximately 100 nm of the trunk region according to some embodiments. In other embodiments, the choke 215 may be located farther from the trunk 230.

In various embodiments, the choke 215 narrows the gate channel so as to increase the current density at the location of the choke. The choke may narrow the gate channel between approximately 10% and approximately 25% in some embodiments, between approximately 25% and approximately 50% in some embodiments, between approximately 50% and approximately 75% in some embodiments, and yet between approximately 75% and approximately 90% in some embodiments, The narrowest portion of the choke may have a width between approximately 5 nm and approximately 100 nm, in some embodiments. In some implementations, the narrowest portion of the choke may have a width less than 5 nm or greater than 100 nm. The narrowing at the choke may extend along the gate channel 212 for a distance less than 200 nm in some embodiments, less than 100 nm in some embodiments, and yet less than 50 nm in some embodiments. In other embodiments, the narrowing at the choke may extend along the gate channel for greater distances.

For a three-terminal device, the choke 215 provides a low-resistance connection between the gate channel and both main channel terminals 220, 240, in some embodiments. This is unlike a conventional field-effect transistor in which a gate insulator separates the gate conductor from the channel region of the device. For a three-terminal device, the choke resistivity may be the same as that of the gate channel material, provided they are formed of the same material. The choke resistance, in a normal conduction state, may be between about 10 ohms and about 50 ohms in some embodiments, between about 50 ohms and about 100 ohms in some embodiments, between about 100 ohms and about 250 ohms in some embodiments, between about 250 ohms and about 500 ohms in some embodiments, and yet between about 500 ohms and about 1000 ohms in some embodiments. In other embodiments, the choke resistance may be higher than 1000 ohms and up to 100 kohms.

Figure 2A:
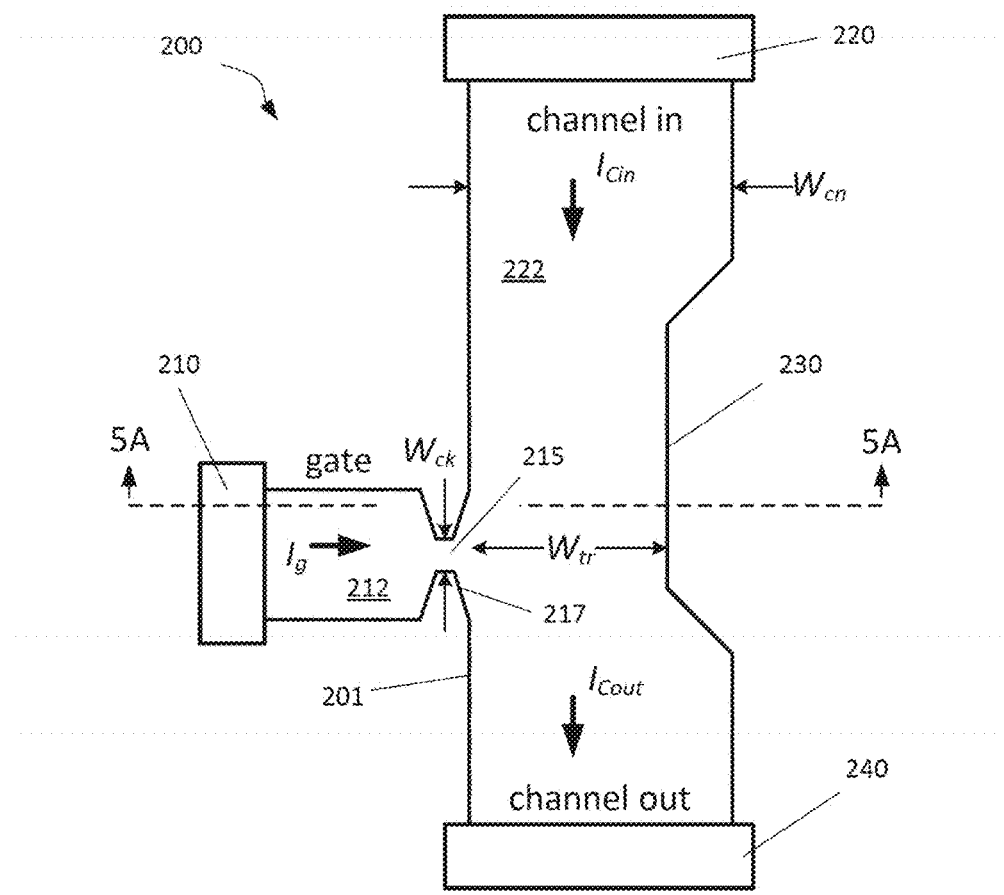
FIG. 2A depicts a three-terminal, single-layer, superconducting transistor, according to some embodiments.
Figure 2B:
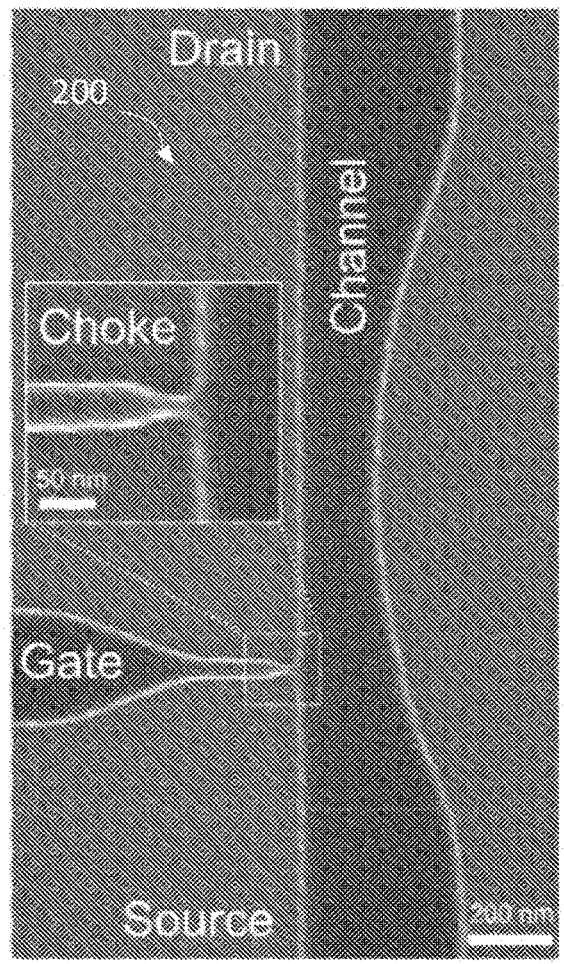
FIG. 2B is a scanning electron micrograph of a three-terminal device that was fabricated as a single layer of NbN on a substrate.

In some implementations, the device may include a gate bulge 217 protruding out from the trunk in the gate region. The bulge may "smooth" the geometrical transition from the choke 215 to the main channel 222, so as to mitigate current crowding or current pinching at abrupt edges of the device. In this regard, the three-terminal device 200 may have smoothed corners (as illustrated in FIG. 2E and FIG. 2B) rather than sharp corners as depicted in FIG. 2A, and may include other smoothing features. Smoothed features may comprise corners having a radius of curvature on the order of a minimum feature size or larger at the location of the corner. For example, at the choke, a minimum feature size may be 10 nm, and corner radii at the choke may be at least 10 nm or larger, whereas at a trunk having a minimum width of 100 nm, corner radii may be at least 100 nm. FIG. 2B is a scanning-electron micrograph of a three-terminal device 200 that was fabricated from a single layer of NbN on a sapphire substrate, according to one embodiment. For this device, the choke 215 is about 20 nm wide, and corners near the choke, along the gate channel, and along the trunk have been rounded or smoothed.

Mitigation of current crowding may prevent unwanted formation of "warmspots" or "hotspots" in the device. A "warmspot" may be a region of the gate channel or main channel at which the local current density is within about 15% of a superconducting critical current density $J_{crit}$. A "hotspot" may be a region of the gate channel or main channel at which the local current density is approximately equal to or exceeds the critical current density $J_{crit}$. If the current density exceeds $J_{crit}$ in a region of the gate channel or main channel, superconductivity will not be supported in that region. The value of $J_{crit}$ may depend upon the type of superconducting material used. For the NbN three-terminal device described herein, $J_{crit}$ was approximately 6 megaamps per square centimeter ($MA/cm^2$).

Figure 2C:
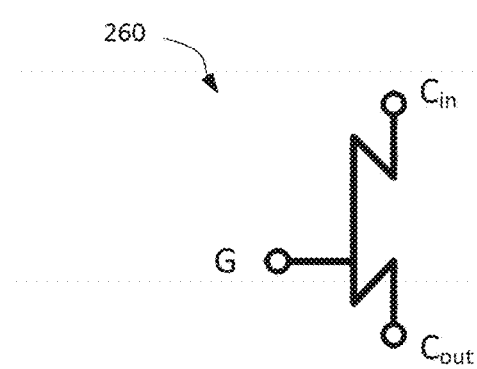
FIG. 2C is a circuit symbol that may be used to represent a three-terminal device.

For purposes of circuit diagrams, a circuit symbol 260, shown in FIG. 2C, may be used to represent the superconducting, three-terminal device 200, according to some embodiments. The control or gate terminal 210 may be labeled "G" or "gate", and the main current-carrying terminals 220, 240 may be labeled "$C_{in}$" and "$C_{out}$", respectively. In some cases, the main terminals may be labeled "D" or "drain" and "S" or "source." When implemented in circuit diagrams, the gate and main terminals may not be labeled, their identification being implicit from the symbol. The gate terminal may be offset in the symbol, to indicate an orientation of the device, as will be understood from further discussion below about the device's switching and impedance characteristics. Other circuit symbols may be adopted in other embodiments.

Figure 2D:
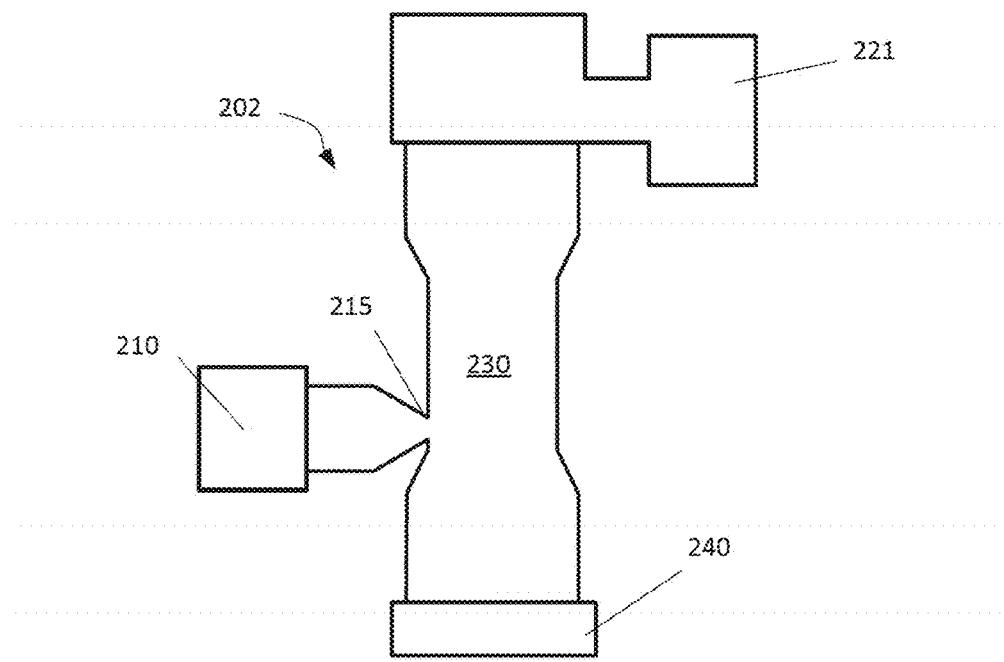
FIGS. 2D-2E depict alternative embodiments of a three-terminal and four-terminal, superconducting transistor, according to some embodiments.
Figure 2E:
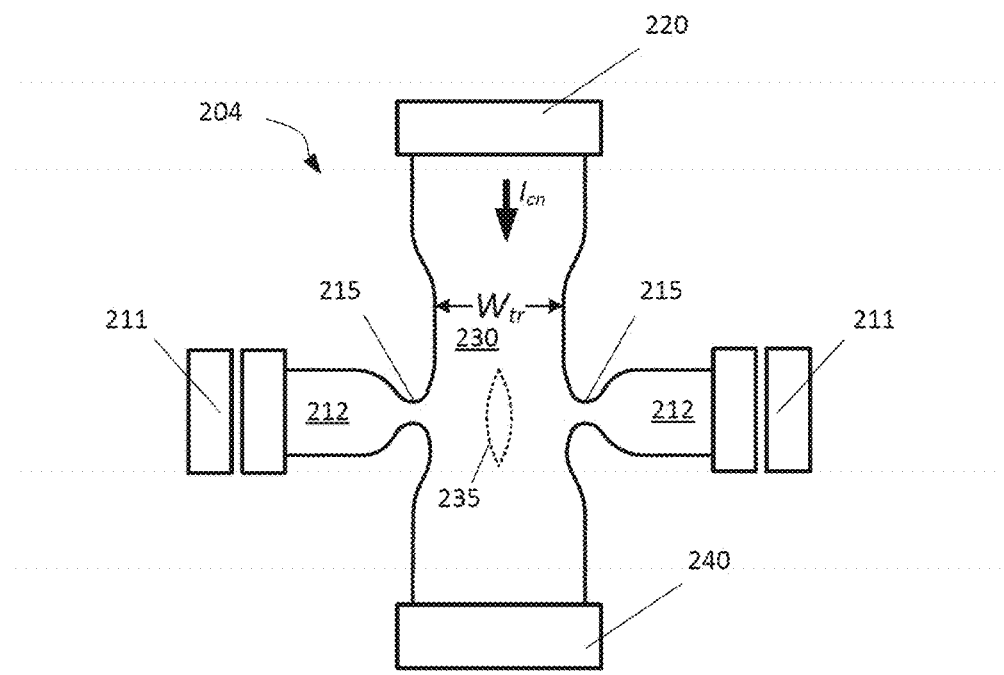
Figure 2F:
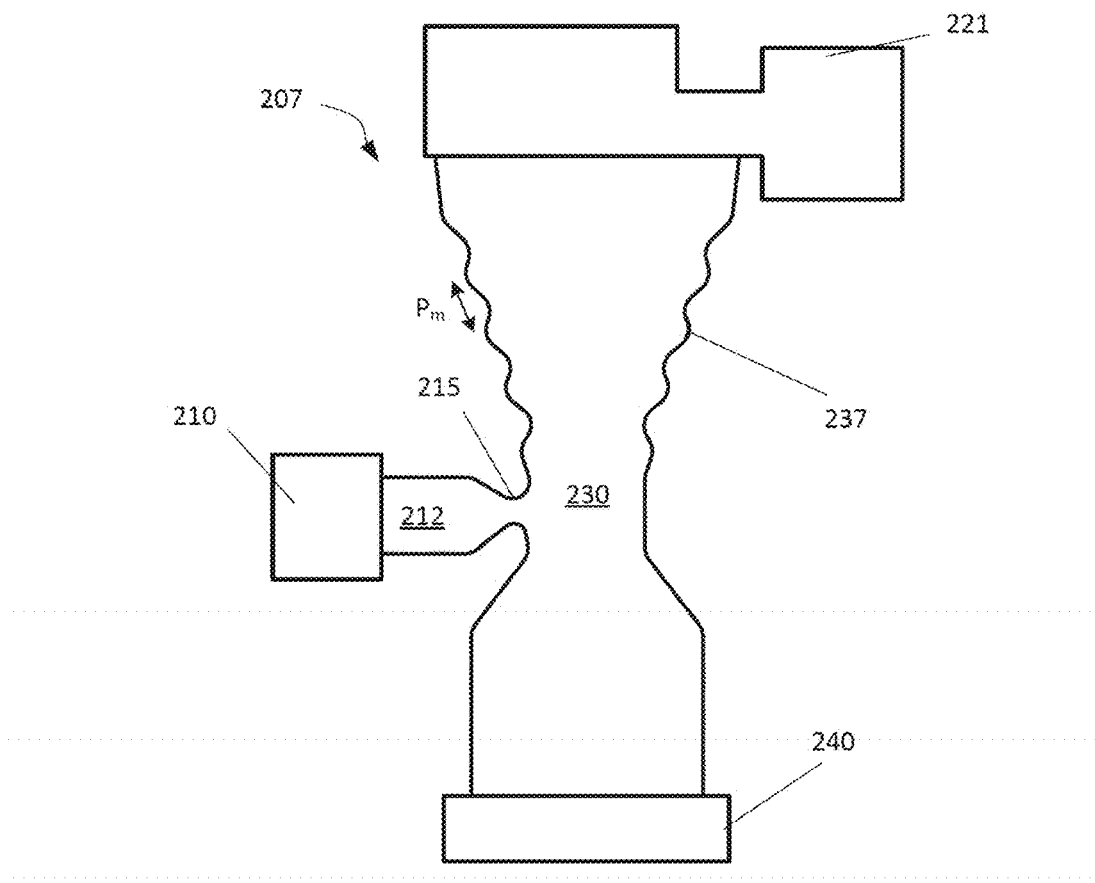
FIG. 2F depicts an embodiment of a three-terminal device that may be used to introduce sidebands onto a carrier signal, according to some embodiments.

FIGS. 2D-2F depict alternative embodiments of superconducting, three-terminal and four-terminal, devices. In some embodiments, a channel input terminal 220 may further include an output terminal 221, as depicted in FIG. 2D, though an output terminal may connect to a same node as the channel input terminal in any suitable manner in some implementations. The output terminal 221 may be formed as a contact pad, in some cases. According to some embodiments, the choke 215 may be formed at the intersection with the trunk, rather than a small distance from the trunk, as depicted in FIG. 2D.

FIG. 2E depicts a symmetrically-structured double-gate device for which gate bias current may be applied to gate channels 212 on opposite sides of the trunk 230. Each gate channel may include a choke 215. The two gate terminals 210 may be tied to a common input terminal (not shown) in some embodiments, so that the device may be operated as a three-terminal device. In other embodiments, the gate terminals 210 may be biased separately, so as to operate the device as a four-terminal logic device. Operation as a logic device will be explained further below.

In some embodiments, the gate inputs may be capacitively coupled to the superconducting, three-terminal or four-terminal devices, as depicted by the gate terminals 211 illustrated in FIG. 2E. Capacitive coupling may be achieved by overlapping thin-film conductive pads separated by a thin insulator, such as an oxide or nitride. In some embodiments, capacitative coupling may also be achieved by forming interdigitating "fingers" of metal and using the fabricated gap between the fingers of each side as a dielectric. Capacitive coupling may be used to provide AC or pulse control of a gate and to reduce direct current loss through the gate.

The embodiment shown in FIG. 2F may be used to introduce sidebands or additional modulation onto a carrier signal. In some embodiments, a three-terminal device may include spatial modulations 237 along the trunk 230 near the gate channel. The modulations 237 may be upstream and/or downstream of the gate channel 212 along the trunk. The spatial modulations may have a regular periodicity or pitch $P_m$. The trunk region where the spatial modulations are located may have an average width that expands along the trunk, as depicted, or may include an extended region having a substantially uniform average width.

Figure 2G:
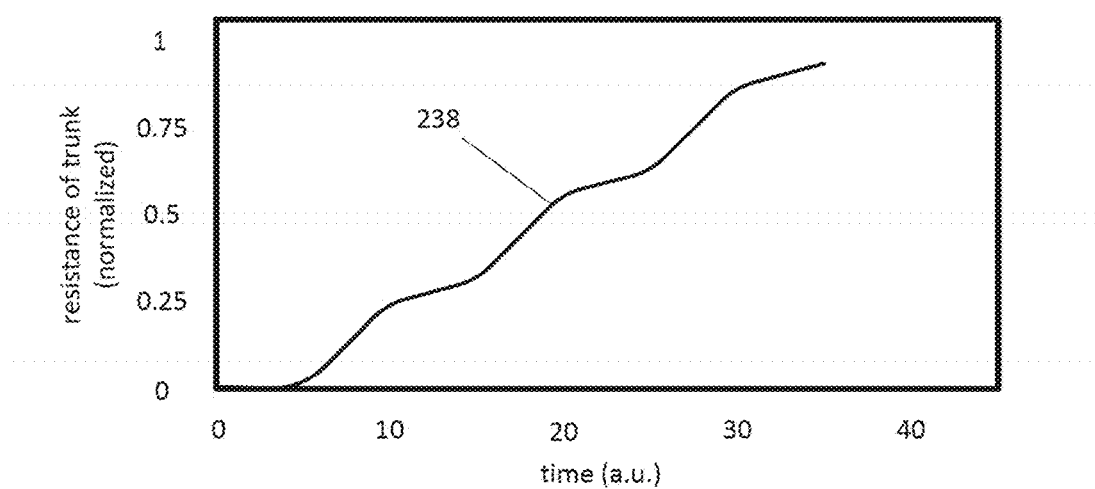
FIG. 2G illustrates a change in trunk resistance as a function of time for the device shown in FIG. 2F, in some embodiments.

As will become clear from the following discussions of device operation, a switching of the three-terminal device to a non-superconducting state can cause a time-varying resistance to form in the trunk region 230 due to the spatial modulations 237. The time-varying resistance may be represented by a graph like that of FIG. 2G. Such a timevarying resistance can modulate the current and/or voltage output from the three-terminal device producing a sideband signal or additional modulation signal that is dependent upon the spatial periodicity $P_m$ of the trunk modulations 237. In some embodiments, signal detection may be based on sideband frequencies, so as to mitigate effects of lowfrequency or DC noise.

Figure 3C:
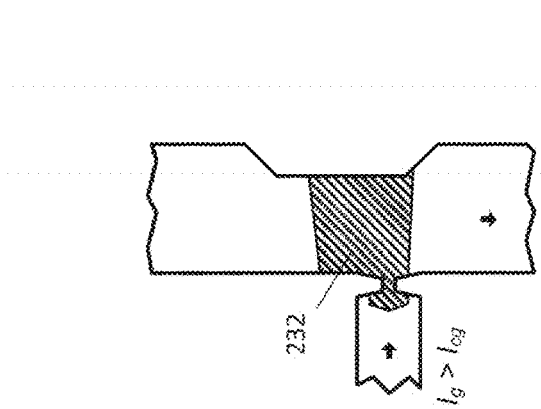
FIGS. 3A-3C depict three operational states of a three-terminal device and corresponding circuit models of a superconducting, three-terminal device, according to some embodiments.
Figure 3C:
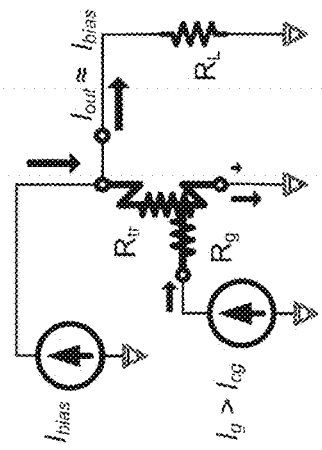
Figure 3B:
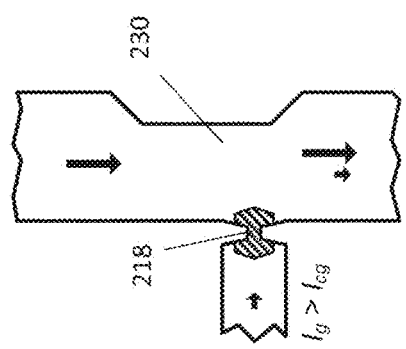
Figure 3B:
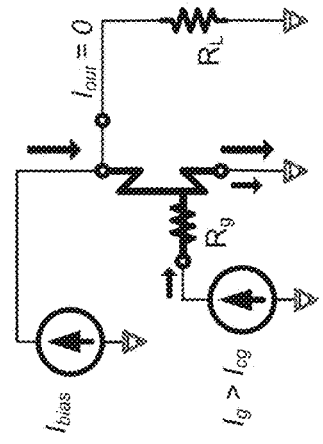
Figure 3A:
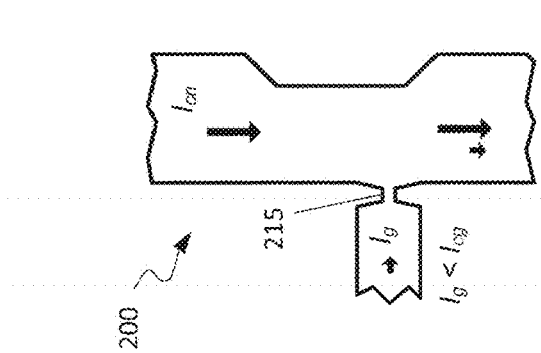
Figure 3A:
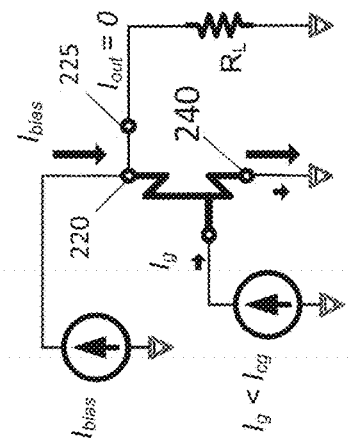

As a further aid to understanding and without being bound to any particular theory, operation of a three-terminal device will be described. FIGS. 3A-3C illustrate an overview of operation of a three-terminal device, and depict how conductivity in at least a portion of the main channel 222 of a three-terminal device 200 may be toggled between a superconducting state (FIG. 3A) and a normal ohmic conduction state (FIG. 3C) via the application of a signal to the device's gate terminal 210. Corresponding circuit representations are shown below the drawings of the three-terminal device as a further illustration of circuit behavior. The circuit diagrams depict one implementation where the three-terminal device 200 is configured in a COPY or non-inverting buffer circuit configuration. In this circuit configuration a HIGH or LOW input applied to the gate terminal of the device 200 is copied at an output terminal of the circuit.

According to some embodiments, a three-terminal device 200 may be placed in a superconducting state, as illustrated in FIG. 3A. In this state, little or no bias current is applied to the gate terminal, and current applied to the main channel 222 will flow through the main channel without resistance since the main channel is superconducting. The gate channel is also superconducting in this state, so any gate currents also see no resistance (no input impedance unless an input terminal 210 is resistive). If there is a resistive load $R_L$ connected to an output terminal 225, it will draw no current, and there will be no voltage appearing at the output terminal. The superconducting state may be referred to as an "OFF" state in some embodiments (e.g., when referring to the bias applied to the gate channel), though may be referred to as an "ON" state in other embodiments (e.g., when referring to the current flowing in the main channel). In some embodiments, gate current or a gate signal may not be applied while the device is in the superconducting state.

The three-terminal device 200 may remain in the superconducting state, provided it remains at cryogenic temperatures and provided the main channel current $I_{cn}$ does not exceed a critical current value $I_{ccn}$ for the channel. The critical current value $I_{ccn}$ would be a current at which a peak current density $J_{cn}$ in the main channel 222 exceeds $J_{crit}$ for the superconducting material. When referring to currents, the symbol "I" is used to refer to the magnitude of current (e.g., units of amps) and the symbol "J" is used to refer to the magnitude of current density (e.g., units of amps/area). The value of $J_{cn}$ may be highest at a location in the trunk 230 of the main channel, and determined from the trunk geometry. According to some embodiments, the value of $I_{cn}$ is less than the critical current value $I_{ccn}$ for the channel while the device 200 is in the superconducting state. Biasing the channel too close to the critical current $I_{ccn}$ may result in inadvertent switching of the device. According to some embodiments, $0.25\ I_{ccn} \le I_{cn} \le 0.95\ I_{ccn}$, and in some embodiments, $0.45\ I_{ccn} \le I_{cn} \le 0.80\ I_{ccn}$. In some implementations, $0.5\ I_{ccn} \le I_{cn} \le 0.75\ I_{ccn}$, though other ranges of channel bias current may also be used. In some implementations, an upper bound of the channel current $I_{cn}$ may be less than about $0.75\ I_{ccn}$. Higher values of channel bias current can provide higher signal gains for the device, but may reduce the three-terminal device's immunity to noise.

Applying an appropriate gate current can cause the device 200 to pass through a transition state (as depicted in FIG. 3B) to a resistive or normal ohmic conduction state, depicted in FIG. 3C. The transition state initiates when a hotspot 218 forms at the choke 215. To toggle the main channel 222 to an ohmic conduction state, a signal (e.g., gate current $I_g$) may be applied to the gate channel 212, such that the critical current density $J_{crit}$ is exceeded at the choke 215. In some embodiments, the peak current density at the choke $J_{ck}$ may be found from the gate current $I_g$ according to the following expression:

$$J_{ck} = I_g \div A_{ck} \qquad \text{EQ. 1}$$

where $A_{ck}$ represents the minimum cross-sectional area at the choke 215 (choke width $W_{ck}$ multiplied by thickness d of the choke's superconducting material). In some implementations, the value of $J_{ck}$ may depend in part on geometry in the vicinity of the choke, e.g., features that may influence or affect current crowding at the choke.

When $J_{ck} \ge J_{crit}$ at the choke, a hotspot 218 forms at the choke as depicted in FIG. 3B and the device enters a transition state. The hotspot represents a normal ohmic conduction region (a resistive region) and may generate heat. In the corresponding circuit model, a gate resistance $R_g$ appears at the choke 215 due to the application of $I_g \ge I_{cg}$ where $I_{cg}$ represents a critical gate current for the device, at approximately which superconductivity is no longer supported in the choke. The size of the choke's constriction may determine the value of the gate's critical current $I_{cg}$ and affect the amount of current that can be switched by the device. In some implementations, a critical current of the gate $I_{cg}$ may be evaluated approximately according to the following expression:

$$I_{cg} \approx J_{crit} \times d \times W_{ck} \qquad \text{EQ. 2}$$

where $J_{crit}$ is the critical current density for the superconducting material from which the choke is formed, d is a thickness of the layer of superconducting material from which the choke formed, and $W_{ck}$ is a width of the narrowest region of the choke.

During the transition state, the hotspot 218 may radiate quasiparticles (e.g., hot electrons) and phonons, which diffuse outward suppressing critical current levels in its vicinity. For example, hot electrons and/or phonons may deplete Cooper pairs that enable superconductivity in the vicinity of the hotspot. By suppressing critical current in the vicinity of the hotspot 218, the hotspot may grow and expand over an area of the device and into and across the trunk 230. As a result, superconductivity can be locally quenched in at least a portion of the trunk to form a stable resistive plug 232. Expansion of the hotspot has been observed in numerical simulations, and results from the simulations are shown in FIGS. 7E-7H and discussed below.

In further detail of the switching operation, a three-terminal device 200 may take advantage of "critical current suppression" behavior. This can allow a small input current at the gate channel 212 to switch a significantly larger current in the device's main channel 222. By employing critical current suppression, an input current into the gate does not just linearly add to the current flowing in the channel to exceed a critical current in the channel, as is the case for a prior device like that shown in FIG. 1. Instead, a small gate current $I_g$ can generate a small, normal-conduction hotspot 218 at the choke 215 in the vicinity of the trunk 230. By radiating quasiparticles and phonons, critical current values $J_{crit}$ in the vicinity of the hotspot can be nonlinearly suppressed, and superconduction across the trunk of the device can be quenched.

As may be appreciated, formation and location of the choke 215 and hotspot 218 affects switching behavior of the three-terminal devices. If the choke 215 is located too far from the trunk 230, switching behavior may not occur at low gate currents. According to some embodiments, the choke 215 may be located within about two hot-electron diffusion lengths $L_D$ from a far edge of the trunk 230 so that critical current suppression extends at least into the trunk. For a double-gate device, the choke 215 may be located within about two hot-electron diffusion lengths $L_D$ from a center of the trunk 230. According to some embodiments, the diffusion length of hot electrons may be evaluated approximately from the following expression:

$$L_D \approx \sqrt{D_e \tau_r} \qquad \text{EQ. 3}$$

where $D_e$ is the diffusion constant for electrons in a superconducting material from which the gate channel is formed and $\tau_r$ is the recombination time or lifetime of hot electrons in the superconducting material in a superconducting state. The characteristic diffusion coefficient $D_e$ for non-equilibrium electrons has been measured to be 45 $nm^2/ps$. (See, Semenov, A. D., Gol'tsman, G. N. and Korneev, A. a., "Quantum detection by current carrying superconducting film," *Phys. C Supercond.* 351, 349-356 (2001).) For superconducting thin-film NbN, the diffusion length is approximately 100 nm. In some implementations, the width of the trunk $W_{tr}$ at the gate channel junction may be between approximately 0.5 $L_D$ and approximately 1.5 $L_D$. In some embodiments, $W_{tr}$ is between approximately 0.5 $L_D$ and approximately 2.0 $L_D$. In some embodiments, $W_{tr}$ is between approximately 0.5 $L_D$ and approximately 3.0 $L_D$. In some implementations, the choke 215 may be located as close to the trunk as possible while still forming a constriction of the channel current.

After the hotspot extends across the trunk 230, the three-terminal device enters a normal- or ohmic-conduction state, as depicted in FIG. 3C. The resistive plug 232 may stabilize in the main channel 222, adding trunk resistance $R_{tr}$ to the main channel as depicted in the corresponding circuit diagram. The ohmic-conduction state may be a stable state, as long as the current in the main channel is not appreciably changed or turned off. According to some embodiments, the resistive plug 232 can impede current flow in the main channel, cause a potential to develop across the main terminals 220, 240, and divert current away from the main channel and out an output terminal. Because of the resistive plug, a voltage will appear between the first terminal 220 and second terminal 240 of the main channel 222. Alternatively or additionally, current will be diverted from the main channel to an output terminal 225, as depicted in the corresponding circuit diagram. In some implementations, a majority of the channel current will be diverted to the output terminal. In prototype devices, the amount of channel current switched in the device can be up to 20 times the amount of current applied to the gate channel. The resistive state may be referred to as an "OFF" state in some embodiments, and an "ON" state in other embodiments.

According to some embodiments, the resistivity of the plug 232 may be between approximately 500 ohms and approximately 3000 ohms in some embodiments. In other embodiments, the plug may have a resistivity value higher or lower than this range. The resistivity of the plug 232 may depend upon trunk and/or channel geometry, main channel input current $I_{cn}$, and the superconducting material used to form the channel and trunk.

Although the trunk's resistive plug 232 is depicted in FIG. 3C as forming mostly upstream from the gate junction, in some embodiments the plug may form at upstream and downstream portions of the trunk with respect to the location of the gate junction. In some implementations, the amount of resistive plug 232 downstream from the gate junction may be approximately equal to or greater than the amount of resistive plug upstream from the gate junction. When the majority of the plug forms upstream of the gate junction, the input impedance at the gate terminal 210 may be lower than if the majority of the resistive plug were to form downstream of the gate junction. This can reduce changes in the device's input impedance between superconducting and normal conducting states. In some implementations, the junction of the gate channel with the main channel may be located near a downstream end of the trunk, so as to reduce changes in gate input impedance between superconducting and ohmic-conduction states of the device. Additionally, the main channel input impedance looking toward the gate is higher than if the majority of the resistive plug were to form downstream of the gate junction. This can help prevent current flow back through the gate from the main channel. In some embodiments, positioning a narrowed trunk downstream of the gate can allow a feedback current to flow from the channel bias back through the gate once the resistive plug is formed.

In some embodiments, the third, ohmic-conduction state of operation (FIG. 3C) may be stable even when the gate current is removed, e.g., $I_g \rightarrow 0$. For example, even though the gate current may be reduced or removed after the device enters the resistive state, the device will remain in the resistive state as long as the channel current $I_{cn}$ is applied to the channel's input terminal. Because the resistive state can exhibit hysteresis or stability upon removal of the gate current, the three-terminal device 200 may be operated as a resettable memory element in some embodiments. The memory element may be reset by reducing or interrupting the channel current $I_{cn}$ or bias current $I_{bias}$. The retention of the ohmic-conduction state after removal of the gate bias may be referred to as a "latched state" or "latched ohmic-conduction state." (See for example, Annunziata, A. J., Quaranta, O., Casaburi, A., Frunzio, L., Ejrnaes, M., . . . Prober, D. E. (2010). Reset dynamics and latching in niobium superconducting nanowire single-photon detectors. *Journal of Applied Physics*, 108(8), 084507, and Kerman, A., Yang, J., Molnar, R., Dauler, E., & Berggren, K. (2009). Electrothermal feedback in superconducting nanowire single-photon detectors. *Physical Review B*, 79(10), 1-4.)

In some implementations, the three-terminal device may be reset to its superconducting state from an ohmic-conduction state by reducing the channel current $I_{cn}$ to a zero value or to a channel current reset value $I_{cre}$, e.g., $I_{cn} \rightarrow I_{cre}$. According to some embodiments, $0 \leq I_{cre} \leq 0.75\ I_{cn}$, whereas in some embodiments, $0 \leq I_{cre} \leq 0.5\ I_{cn}$, in some embodiments, $0 \leq I_{cre} \leq 0.3\ I_{cn}$, and yet in some implementations, $0 \leq I_{cre} \leq 0.2\ I_{cn}$. In some implementations, $0.5\ I_{cn} \leq I_{cre} \leq 0.9\ I_{cn}$, $0.7\ I_{cn} \leq I_{cre} \leq 0.9\ I_{cn}$ in some embodiments, $0.5\ I_{cn} \leq I_{cre} \leq 0.7\ I_{cn}$ in some embodiments, and yet $0.3\ I_{cn} \leq I_{cre} \leq 0.5\ I_{cn}$ in some embodiments. A channel reset current value may depend upon device geometry, channel bias, and superconducting material.

In some embodiments, removing or reducing only the gate current may cause the three-terminal device 200 to return to the superconducting state. This may occur when the channel bias current is significantly below the channel critical current. For example, $I_{cn} \leq 0.5\ I_{ccn}$ in some embodiments, or $I_{cn} \leq 0.25\ I_{ccn}$ in some embodiments.

To further understand the different states of operation of a three-terminal device, a theoretic framework was developed. The theoretical analysis was undertaken for instructional purposes only, and should not be interpreted as limiting the described embodiments of various three-terminal devices. To analyze the input/output characteristics of a superconducting, three-terminal device, it is helpful to enumerate the possible electrical states the device can occupy, both stable and unstable, as described above in connection with FIGS. 3A-3C. For this analysis, the three possible states (superconducting, transitional, and ohmic-conduction) are denoted as S1, S2, and S3. Several assumptions are made in this analysis, namely that the resistance between the gate-channel junction and the ground reference potential is negligible. Further, it is assumed that the resistance of the trunk region of the channel $R_{tr}$ is a binary on/off normal resistance that spans the length of the channel trunk.

At superconducting equilibrium, where $J<J_{crit}$ everywhere, the system is stable in S1. If the gate current $I_g$ is increased to values greater than the critical current of the choke, then a hotspot forms in the choke and the system transitions from S1 to S2. The state S2 is a stable state only if the channel current $I_{cn}$ is below a threshold critical current $I_{csup}$, a suppressed critical current of the channel. As explained further below, the presence of a hotspot in the choke can suppress a critical current value of the channel. If $I_{cn} > I_{csup}$, however, S2 is unstable and a hotspot expands in the trunk of the device, transitioning the device to the state S3 over the course of a few picoseconds. Once in S3, the system is again stable. The system may remain in S3 until the current through the main channel drops below a retrapping current for the channel, $I_{retrap}$. As can be seen from the circuit diagram of FIG. 3C, current splitting between the channel resistance $R_{tr}$ and output resistor $R_L$ means that $I_{cn}$ is not necessarily equal to the bias current source $I_{bias}$.

A next step in the analysis is to determine conditions or criteria necessary for the stability of each state. Beginning by looking at the current output of the device for different states, we see that in states S1 and S2, the output is LOW, as the entire channel superconducting and thus shorted to ground. Examining the output and current through the channel in detail based on the resistor configurations in FIG. 3C yields Table 1.

TABLE 1

|  | S1 | S2 | S3 |
|---|---|---|---|
| $I_{out}$ | 0 | 0 | $\dfrac{R_{tr}}{R_{tr} + R_L} I_{bias}$ |
| $I_{cn}$ | $I_{bias}$ | $I_{bias}$ | $\dfrac{R_L}{R_{tr} + R_L} I_{bias}$ |

A first condition is that an output from one stage or three-terminal device of a circuit should be able to trigger a next stage in the circuit. This leads to the condition that the output current in S3 must be larger than the critical current of the choke, so that a seed hotspot can be formed in the next stage. Writing this out explicitly in terms of the ratio of output resistance to channel resistance, and assuming the first stage is in S3, gives the following expressions.

$$i_{out} > I_{cg} \qquad \text{EQ. 4A}$$

$$\frac{R_{tr}}{R_{tr} + R_L} I_{bias} > I_{cg} \qquad \text{EQ. 4B}$$

$$\Rightarrow \frac{R_L}{R_{tr}} > \frac{I_{bias}}{I_{cg}} \qquad \text{EQ. 4C}$$

A next condition is that the state S3 should be stable. That is, when the trunk resistive plug is formed, current will be diverted out of the channel, but enough current should remain in the now-resistive channel for Joule heating to maintain the hot spot or resistive plug in the trunk. Otherwise, the device's output current may undergo oscillations as the channel becomes resistive, diverts current, and then becomes superconducting, bringing the current back, then resistive again, ad infinitum. The minimum amount of current necessary to maintain the trunk hotspot is defined as $I_{retrap}$, leading to the following conditions.

$$i_{cn} > I_{retrap} \qquad \text{EQ. 5A}$$

$$\frac{R_L}{R_{tr} + R_L} I_{retrap} > I_{retrap} \qquad \text{EQ. 5B}$$

$$\Rightarrow \frac{R_L}{R_{tr}} > \frac{1}{\frac{I_{bias}}{I_{retrap}} - 1} \qquad \text{EQ. 5C}$$

According to some embodiments, an important parameter to control is the ratio of the output resistance $R_L$ to the channel resistance $R_{tr}$. This ratio controls the current splitting between the channel and the output. A range for this ratio over which a three-terminal device will operate as desired may be given by the following expression.

$$\frac{1}{\frac{I_{bias}}{I_{retrap}} - 1} < \frac{R_L}{R_{tr}} < \frac{I_{bias}}{I_{cg}} \qquad \text{EQ. 6}$$

According to some embodiments, variables other than $I_{retrap}$ can be specified based on the device geometry and circuit elements. However, $I_{retrap}$ may be dependent on material parameters (substrate cooling, specific heat, etc). To estimate $I_{retrap}$, some simplifications are applied to a two-temperature model that is used to solve for steady-state operation of the three-terminal device. The model normally looks like coupled heat diffusion equations with two different effective temperatures, electron temperature $T_e$, and the phonon temperature $T_{ph}$. The PDEs may be written as follows.

$$\dot{T}_e = \qquad \text{EQ. 7A}$$
$$-\frac{1}{\tau_{e-ph}(T_e)}(T_e - T_{ph}) + \frac{1}{C_e(T_e)} j_d(x,y,t)^2 \rho_d(x,y,t) + D_e \nabla^2 T_e$$

$$\dot{T}_{ph} = \frac{C_e(T_e)}{\tau_{e-ph}(T_e) C_{ph}(T_{ph})}(T_e - T_{ph}) - \frac{1}{\tau_{esc}}(T_{ph} - T_0) + D_{ph} \nabla^2 T_{ph} \qquad \text{EQ. 7B}$$

where $C_e$ is electron specific heat of the superconducting material, $C_{ph}$ is the phonon specific heat of the superconducting material, $\tau_{e-ph}$ is electron-phonon interaction time in the superconducting material, $j_d$ is the current density, $\rho_d$ is the resistivity of the superconducting material in an ohmic-conduction state, $D_e$ is the diffusion constant of hot electrons, $D_{ph}$ is the diffusion constant of phonons, and $T_0$ is the substrate temperature.

In some embodiments, it may be helpful to determine a range of bias currents (e.g., minimum bias current) where a nanowire or constriction will remain in a resistive state. For this, it must be determined whether the system in a resistive state will ever drop below the critical temperature $T_c$: that is, if $dT/dt \geq 0$ or not, when evaluated at $T=T_c$. Assuming a nanowire in a resistive state has been biased steadily for a long time, it may be assumed that $T_e$ and $T_{ph}$ are approximately equal. The two-temperature mode can then be reduced to a single effective temperature T. Further assuming that the entire wire is at a uniform temperature, meaning $\nabla^2 T=0$. Then, there are two contributions to the temperature dynamics $dT/dt$, the Joule heating contribution and heat energy escaping out through the substrate, which may be expressed as follows.

$$\frac{d}{dt} T = \frac{1}{C_e(T)} J_{cn}^2 \rho - \frac{1}{\tau_{esc}} (T - T_{sub}) \qquad \text{EQ. 8}$$

where $J_{cn}$ represents the current density at the hotspot, $\tau_{esc}$ is the phonon escape time from the superconducting material into the substrate, and $T_{sub}$ represents the temperature of the substrate.

When evaluated at $T_c$, the system will not drop below $T_c$ and become superconducting as long as $dT/dt>0$. Only once $J_{cn}$ becomes small enough that $dT/dt<0$, T will drop below $T_c$ and the system will enter a superconducting state S1 again. According to some embodiments, a range of $J_{cn}$ in which the channel will remain in the ohmic-conduction state, and a retrapping current density $J_{retrap}$, can be found.

$$\frac{1}{C_e(T_c)} J_{cn}^2 \rho < \frac{1}{\tau_{esc}} (T_c - T_{sub}) \qquad \text{EQ. 9A}$$

$$J_{retrap} = \sqrt{\frac{C_e(T_c)}{\rho \tau_{esc}} (T_c - T_{sub})} \qquad \text{EQ. 9B}$$

$J_{retrap}$ can be calculated from parameters used in our simulations. Taking $C_e(T_c)=2400$ J/K, $\rho=2.4$ e-6 $\Omega$-m, $\tau_{esc}=30$ ps, $T_c=10.5$ K, $T_{sub}=2.5$ K yields a value of $J_{retrap}=0.36*J_{crit}$. Running a full numerical simulation and varying the bias current, we find that $J_{retrap}=0.34*J_{crit}$, showing good agreement with the foregoing theoretical estimation.

With respect to current control in its main channel, a superconducting, three-terminal device operates somewhat like a MOSFET or a bipolar junction transistor configured as a switch. For example, a MOSFET includes a gate, which may be biased to either a HIGH or LOW state, and a channel with variable resistivity. The biased state of the gate can toggle the resistivity of the MOSFET channel between a highly resistive state and a low resistive state. For the superconducting, three-terminal device 200, the channel may exhibit no resistance when no bias is applied to the gate terminal 210, and may exhibit between approximately 500 ohms and approximately 3000 ohms when the gate is biased above a threshold current level $I_{cg}$, according to some embodiments. Unlike the MOSFET in which a gate insulator is formed between the gate terminal and device channel, the superconducting, three-terminal device 200 may have a gate that is DC coupled to the channel in some embodiments.

Figure 4:
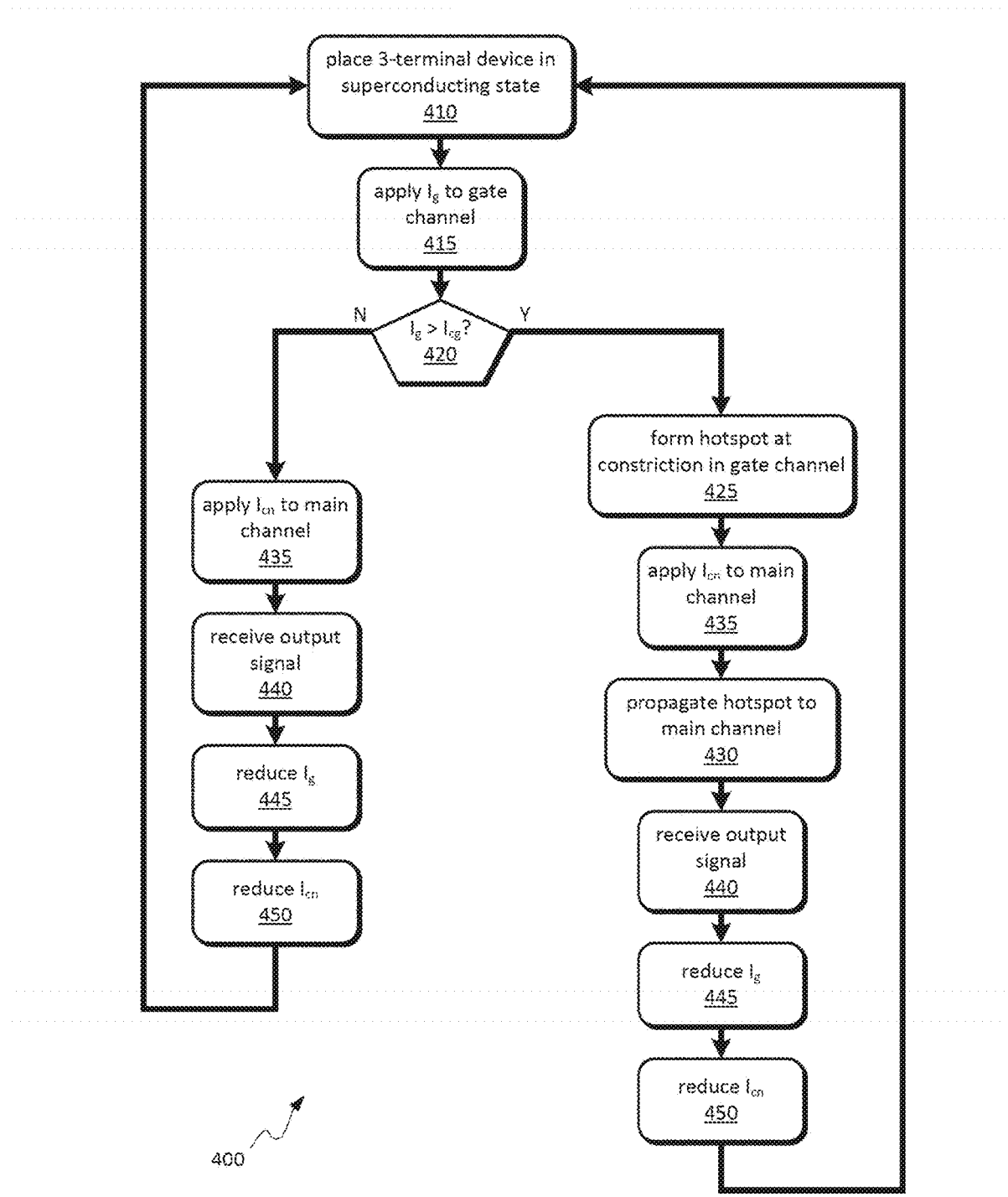
FIG. 4 illustrates a method of operation of a three-terminal device, according to some embodiments.

A method 400 of operating a three-terminal device is depicted in the flow diagram of FIG. 4. According to some embodiments, a method may comprise placing 410 a three-terminal device in a superconducting state, e.g., as in FIG. 3A. A gate bias current $I_g$ may be applied 415 to a gate channel of the three-terminal device. The three-terminal device may determine 420 whether the applied signal exceeds a critical current value for the gate channel. If $I_g$ is less than $I_{cg}$, then the acts depicted in the left branch of FIG. 4 may occur. For example, a current $I_{cn}$ may be applied 435 to the main channel of the three-terminal device, and a signal received 440 or recorded at an output terminal of the three-terminal device. The gate bias $I_g$ may then be reduced, and, in some embodiments, the channel bias $I_{cn}$ may be reduced. The device may thereby be returned to its superconducting state.

If $I_g$ is equal to or more than $I_{cg}$, then the acts depicted in the right branch of FIG. 4 may occur. For example, a hotspot may be formed 425 at the constriction or choke in the gate channel, and a current $I_{cn}$ may be applied 435 to the main channel of the three-terminal device. The hotspot may propagate 430 across the trunk of the main channel, and a signal received 440 or recorded at an output terminal of the three-terminal device. The gate bias $I_g$ may then be reduced, and, in some embodiments, the channel bias $I_{cn}$ may be reduced. The device may thereby be returned to its superconducting state. In some embodiments, the three-terminal device may be cycled through the acts depicted in FIG. 4 at kilohertz frequencies, megahertz frequencies, or even gigahertz frequencies.

A superconducting, three-terminal device 200 may be fabricated using any suitable microfabrication processes. One embodiment of a fabrication process is depicted in FIGS. 5A-5E. According to some embodiments, fabrication of a superconducting, three-terminal device may begin by depositing a layer 530 of superconducting material (e.g., NbN) on a substrate 510. The layer of superconducting material 530 may have a thickness d that is between about 5 nm and about 50 nm, according to some embodiments. In other embodiments, the superconducting material 530 may have a thickness d that is between about 50 nm and about 250 nm. Three-terminal devices may be designed to handle higher currents in the main channel, and may comprise even thicker layers of superconducting material 530. The superconducting material may be deposited by e-beam evaporation or RF/DC magnetron sputtering, in some implementations. In other embodiments, other materials and microfabrication techniques may be used. For example, a suitable high-$T_c$ material (e.g., a superconductor comprising YBaCuO, HgTlBaCaCuO, $MgB_2$, BISCCO, Nb, NbTiN, NbCN, Al, AlN, WSi, Ga, In, Sn, Pb, or MoGe, etc) may be grown or deposited on a substrate using other techniques, such as chemical vapor deposition, plasma deposition, atomic layer deposition, vapor phase epitaxy, sputtering, etc. In some cases, a clean superconductor of Nb, Al, Ga, In, Sn, or Pb may be deposited to form a superconducting device of the disclosed embodiments. A clean superconductor may be one for which the mean-free-path of electrons is greater than a coherence length of the superconducting material.

The substrate may be an insulating substrate in some embodiments, or may be a substrate coated with an insulator such as an oxide or nitride layer. In some embodiments, the substrate comprises a sapphire substrate. A resist layer 520 may be formed over the layer of superconducting material 530. In some embodiments, the resist may be a photoresist, electron-beam resist, or ion-beam resist, though other resists may be used in various implementations. In some embodiments, the resist may be hydrogen silsesquioxane (HSQ) resist that is suitable for high-resolution electron-beam lithography. The resist may provide etch selectivity over the underlying superconducting material. In some embodiments, a hard mask (e.g., of an oxide, nitride, metal, ceramic or other suitable material) may be formed as a resist mask 522 using other lithographic techniques.

Figure 5A:
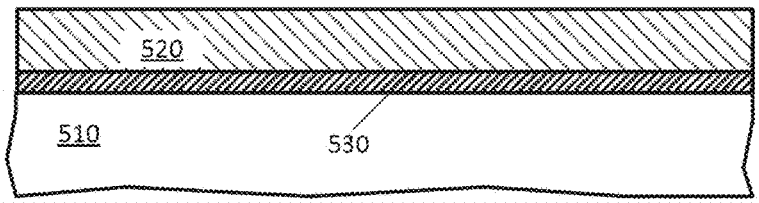
FIGS. 5A-5E depict structures corresponding to a method of fabricating a superconducting, three-terminal device, according to some embodiments.
Figure 5B:
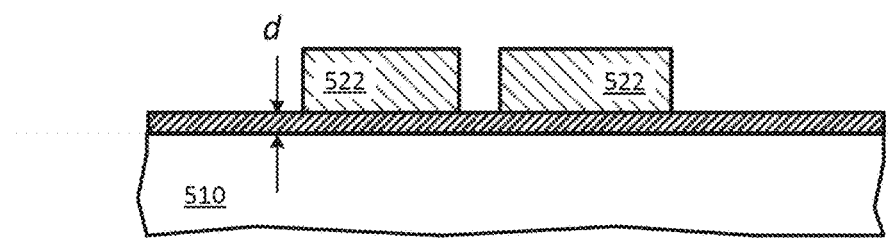
Figure 5C:
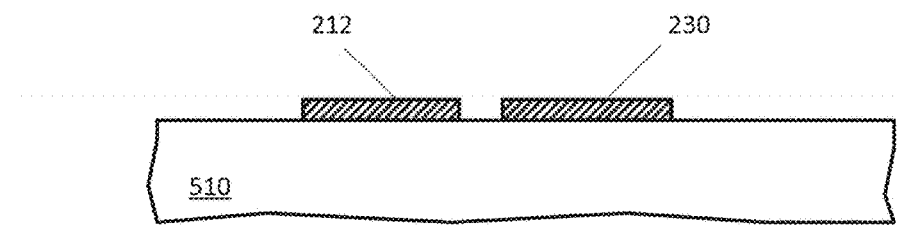

The resist layer 520 may be exposed and developed to form a resist mask 522 of a three-terminal device 200, as depicted in the elevation view of FIG. 5B. The view in FIG. 5B represents a cross-sectional view of the device depicted in FIG. 2A, taken at the dashed line in FIG. 2A. The substrate may then be subjected to an etching process, for example an anisotropic dry etch to remove superconducting material not protected by the resist mask 522. After the etch, the resist may be stripped from the substrate leaving a single-layer, superconducting, three-terminal device (e.g., a device as depicted in the plan view of FIG. 2A).

Figure 5D:
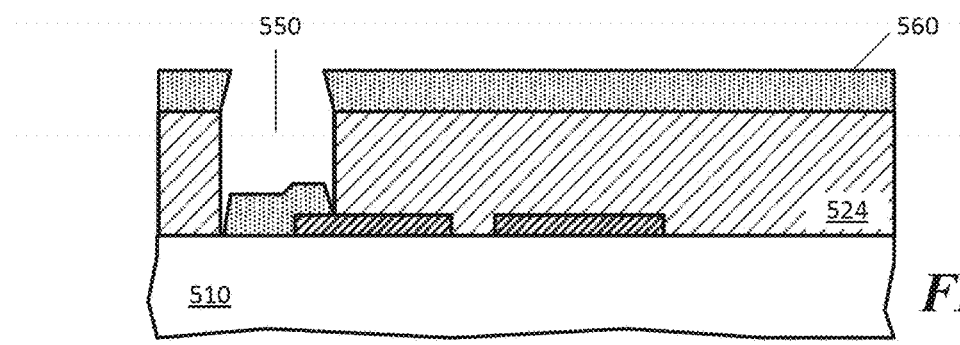
Figure 5E:
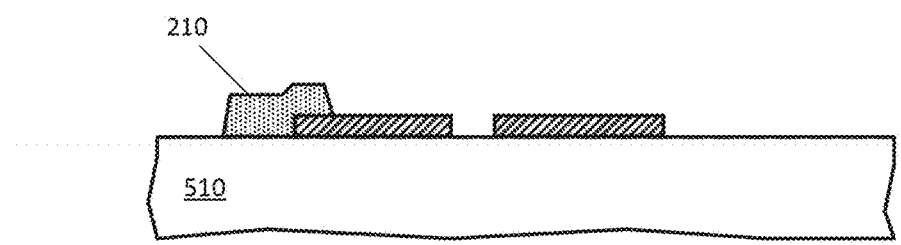

In some embodiments, contact pads or terminals may be formed for connecting to the gate and main channel of the device. FIGS. 5D-5E depict a lift-off process that may be used to form the gate terminal 210 and main channel terminals 220, 240 depicted in FIG. 2A. For example, a photoresist 524 may be formed over the three-terminal device, and subsequently patterned to open up areas 550 at the gate and main channel terminal locations. One or more conductive layers 560 may then be deposited over the region of the substrate. According to some embodiments, conductive layers of titanium and/or gold may be deposited. In some implementations, gold may be deposited on the NbN. In the open areas, the conductive layers form in electrical contact with the superconducting material. The resist 524 may then be stripped from the substrate (e.g., dissolved by a solvent) to remove both the resist and the overlying conductive layer or layers 560. The resulting structure may be as depicted in FIG. 5E. In some embodiments, the resist and overlying conductive layer may be left on the substrate. When left on the substrate, the resist 524 and conductive layer 560 may be used to provide a ground plane for shielding the superconductive circuitry from external electromagnetic noise.

The gate terminal 210 may comprise a thicker metal that provides a more robust connection to the superconducting device and facilitates electrical connection to the device. In some embodiments, the gate terminal 210 may be formed of gold, aluminum, titanium, copper, or any combination thereof. The gate terminal, in some cases, may be a superconducting material, a nonsuperconducting material, a semiconducting material, or any suitable conductor that can carry current into the device. According to some embodiments, the single superconducting layer of a three-terminal device may be fabricated using a lift-off process.

Multi-level circuits may also be formed using the superconducting, three-terminal devices. For example, a first level of circuitry may be formed on a substrate, and subsequently covered with at least one insulating layer. Additional levels of circuitry, including superconducting, three-terminal devices may be formed over the first level using similar fabrication techniques. Multi-level interconnects or vias may be formed to electrically connect the different levels of circuitry.

Referring again to FIGS. 3A-3C and the description of device operation, it will be appreciated that channel currents significantly larger than gate currents can be switched by the application of the gate current to the device's channel. Accordingly, a small gate current can be used to drive larger loads, in some embodiments, or additional superconducting, three-terminal devices in some implementations. According to some embodiments, the load $R_L$ may comprise one or more gate terminals of additional superconducting, three-terminal devices. Because the three-terminal device 200 exhibits current gain (switching a larger main channel current with a smaller gate current), one three-terminal device may be used to drive a plurality of three-terminal devices in a "fan-out" configuration. This can be useful to implement logic circuitry, or to operate a three-terminal device as a line driver. In some embodiments, a first three-terminal device may be used to drive a second three-terminal device that has different dimensions than the first device, so as to obtain further current amplification. Such a pair of three-terminal devices may be analogous to a Darlington pair of bipolar transistors.

Figure 6A:
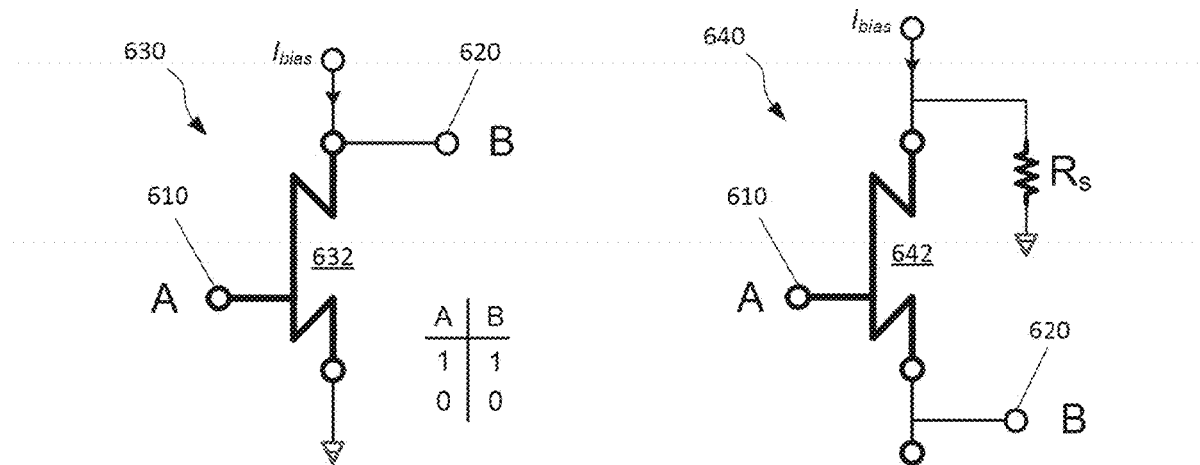
FIGS. 6A-6C depict various superconducting logic gates that may be implemented with superconducting, three-terminal devices, according to some embodiments.
Figure 6B:
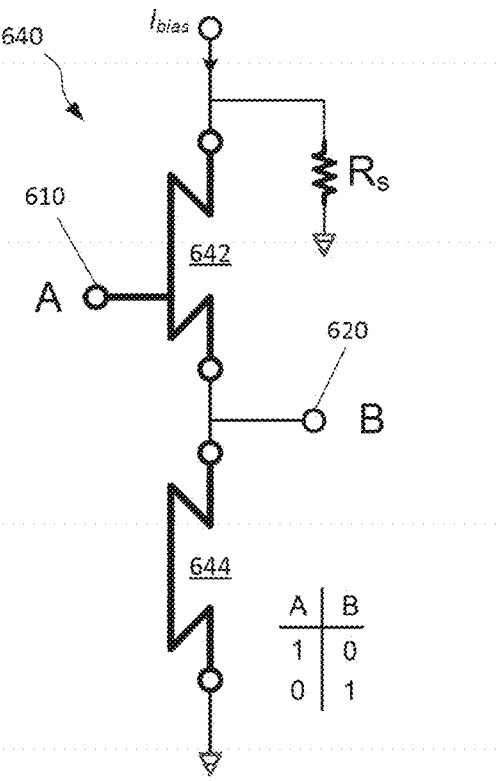
Figure 6C:
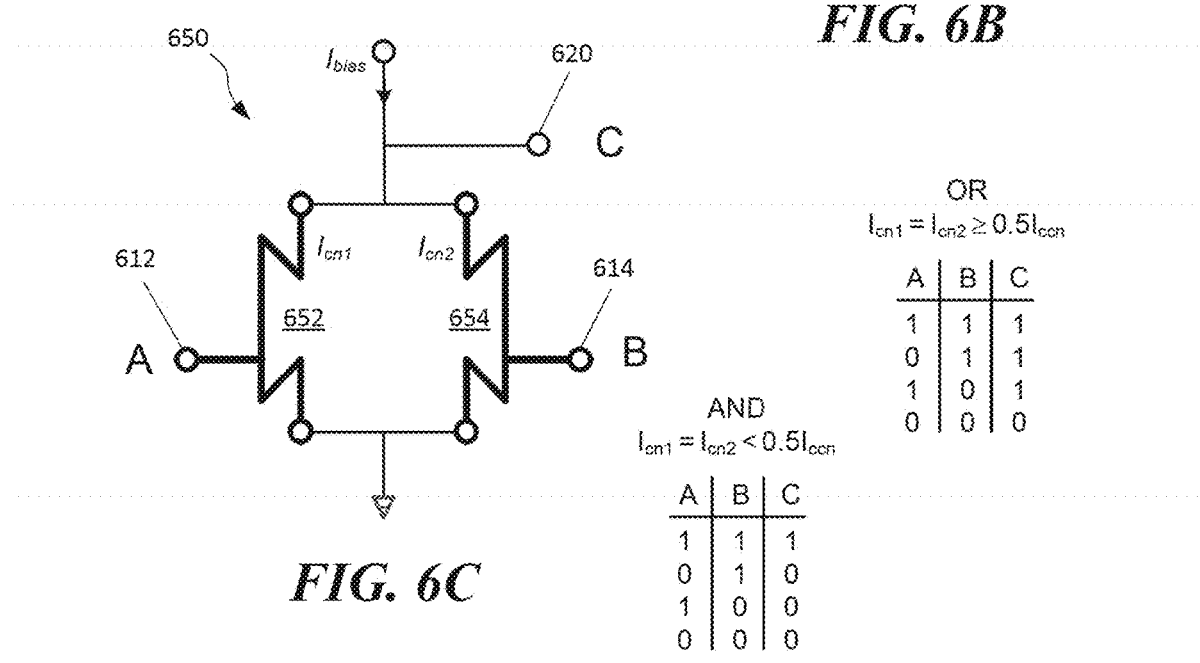

Several different types of superconducting logic elements may be formed from superconducting, three-terminal and four-terminal devices described above. The logic elements can be readily fabricated in parallel using integrated planar fabrication techniques, e.g., as described in connection with FIGS. 5A-5E, arranged in simple or complex logic circuits on a single substrate, and may be used at cryogenic temperatures. A basic set of logic elements that may be formed from combinations of three-terminal devices are depicted in FIGS. 6A-6C. Truth tables for each logic element are included with the drawings. In some embodiments, the truth table values can be obtained at outputs B or C for the logic elements by reducing main channel bias current source $I_{bias}$ to a zero value or low value before applying a signal to the inputs A or A and B. Reducing $I_{bias}$ can remove transistors from a latched ohmic-conduction state.

According to some embodiments, the logic elements described below may be configured to operate in non-latching regimes. To prevent latching, main channel bias currents may be reduced. Such a reduction may result in reduced gain for a three-terminal device. As a result, output impedances may need to be more carefully controlled.

FIG. 6A depicts a COPY gate 630, non-inverting amplifier, or buffer, according to some embodiments, and was described in connection with FIGS. 3A-3C. The COPY gate comprises a superconducting, three-terminal device 632 having its main channel terminals connected in series between a current bias source $I_{bias}$ and a reference potential (e.g., a ground potential). An input signal may be applied to a gate channel 610 of the logic element, and an output signal may be received from an output terminal 620 of the logic element. The relation between signals appearing at its input (also labeled "A") and its output "B" are shown in a truth table inset in the drawing. For example, a "high" (logic 1) signal ($I_g \geq I_{cg}$) applied to the device's input A forms a resistive plug in the main channel and diverts main channel current providing a "high" signal at the output B. Conversely, a "low" (logic 0) signal ($I_g < I_{cg}$) at the input yields a low signal at the device's output, provided the device is in a superconducting state when the low signal is applied, and not in a latched ohmic conduction state.

FIG. 6B depicts a logic NOT gate 640 or inverter. The circuit includes a first superconducting, three-terminal device 642 and a second superconducting device 644 having their main channel terminals connected in series between a current bias source $I_{bias}$ and a reference potential (e.g., a ground potential). A shunt resistor $R_s$ may be connected between a main channel input terminal of the first device 642 and a reference potential. An output terminal may connect to the main channel output terminal of the first three-terminal device 642. In some embodiments, the second superconducting device comprises a main channel only (i.e., no gate channel), and the critical current value of the second superconducting device's main channel $I_{ccn2}$ may be less than a critical current value of the first superconducting device's main channel $I_{ccn1}$. The bias current $I_{bias}$ and/or device geometries may be selected such that the second device 644 is normally in an ohmic-conduction (non-superconducting) state, whereas the first three-terminal device is normally superconducting. For example, the second device 644 may have a narrower trunk than the first three-terminal device 642, so that the critical current in the main channel of the second device is exceeded under normal bias conditions. In this case, the second device 644 may comprise a superconducting two-terminal device 208, as depicted in FIG. 2H. The two-terminal device 208 may operate in two stable states: a superconducting state in which it will transport current at no resistance, and an ohmic conduction state in which a resistive plug is formed in the trunk 230. The resistive plug may form when an input current exceeds a critical current in the main channel. In some embodiments, a superconducting two-terminal device 208 may provide a current shunt when in a superconducting state, and a blocking resistance when in a non-superconducting state.

In some embodiments, the second superconducting device 644 may comprise a three-terminal device. A gate channel of the second three-terminal device 644 may not be used (and is not shown) in some embodiments. For example, the gate channel may be floating. In some embodiments, the gate terminal of the second three-terminal device may be connected to its channel input terminal.

If no signal is applied to the input A, bias current may flow through the main channel of the first device 642 and out the output B, since the second three-terminal device 644 is in an ohmic-conduction state. Applying a signal that exceeds the gate channel critical current at the input A may toggle the first three-terminal device to an ohmic-conduction state, diverting channel bias current out of its main channel and to the shunt resistor $R_s$. The reduction of main channel current toggles the second device 644 to a superconducting state, pulling the output terminal 620 to ground or reducing current flow at the output B. The inset truth table for the logic inverter that may be obtained as long as the first three-terminal device is not in a latched ohmic-conduction state. The shunt resistor may have a resistance between about 50 ohms and about 1000 ohms, in some embodiments. According to some embodiments, shunt resistor may have a resistance of about 350 ohms.

The circuit depicted in FIG. 6C may be operated as an AND or OR gate depending upon the bias current $I_{bias}$ levels applied to the channels of the parallel three-terminal devices. This logic element may be referred to as an AND/OR gate 650. In some embodiments, the AND/OR gate 650 comprises a first superconducting, three-terminal device 652 having its main channel terminals connected in parallel with main channel terminals of a second superconducting, three-terminal device 654 and connected between a current bias source $I_{bias}$ and a reference potential (e.g., a ground potential). A first input A may comprise a gate channel input terminal 612 of the first three-terminal device 652, and a second input B may comprise a gate channel input terminal 614 of the second three-terminal device 654. An output terminal 620 may connect to the main channel input terminals of the two devices.

The functionality of the AND/OR gate 650 may be determined by the amount of bias current applied to the main channels of the two three-terminal devices. For example, if the bias current in each channel is near each trunk's critical current, applying input to either the A or B inputs will toggle both channels to a non-superconducting regime, yielding OR functionality. For example, when an input signal exceeding the gate channel critical current appears at an input (e.g., A), the first three-terminal device toggles to an ohmic-conduction state diverting its main-channel current ($I_{cn1}$) to the other device, and the diverted current combines with the bias current already present in that device ($I_{cn1}+I_{cn2}$) to exceed the critical current $I_{ccn2}$ in the main channel other device. The excess main-channel current toggles the second device to an ohmic-conduction state, and diverts bias current to the output C. According to some embodiments, the first and second three-terminal devices may be substantially identical in geometry, such that they have substantially the same main-channel critical currents ($I_{ccn1}=I_{ccn2}=I_{ccn}$) In some implementations, the following bias conditions provide OR functionality for the AND/OR gate 650:

$$I_{cn1}=I_{cn2}\geq 0.5 I_{ccn} \qquad \text{EQ. 11}$$

where $I_{cn1}$ and $I_{cn1}$ are the bias currents applied to the main channels in the first and second three-terminal devices, respectively. In other embodiments, the geometries of the first and second three-terminal devices may differ, such that they have different main-channel critical currents. Accordingly, the channel bias currents may differ.

Alternatively, if the bias current in each main channel is sufficiently lower than each trunk's critical current, application of a bias to both A and B inputs is necessary to toggle both channels to a non-superconducting regime, yielding AND functionality. For example, applying a signal that exceeds a gate channel critical current to an input (e.g., B) may toggle the second three-terminal device 654 to an ohmic-conduction state, diverting current from its main channel to the main channel of the first three-terminal device 652. However, the combination of the diverted bias current and bias current already present in the main channel of the first device ($I_{cn1}+I_{cn2}$) may not be enough to exceed the critical current $I_{ccn}$ in the first device's main channel. Therefore, the applied bias $I_{bias}$ continues to flow through the first three-terminal device, and is not diverted to the output C. Only when signals exceeding the gate channel critical currents are applied to both inputs A and B will both three-terminal devices be toggled to an ohmic-conduction state and current diverted to the output C. In some implementations, the following bias conditions provide AND functionality for the AND/OR gate 650:

$$I_{cn1}=I_{cn2}<0.5 I_{ccn} \qquad \text{EQ. 12}$$

An interesting feature of the AND/OR gate 650 shown in FIG. 6C is that the same circuit may be dynamically reprogrammed in situ as an OR or AND gate. For example, the same A and B inputs may be used for OR logic at a first time, and AND logic at a second time during signal processing. The reprogramming can be done by adjusting the applied bias $I_{bias}$ between first and second values, such that either EQ. 11 is satisfied for OR logic or EQ. 12 is satisfied for AND logic. Reprogrammable hardware can reduce a number of transistors in a data processing circuit and enable flexible logic circuitry.

In some implementations, an AND/OR gate may comprise a superconducting, four-terminal device as depicted in FIG. 2E. For example, under a first channel bias current value $I_{cn1}$ hotspot formation may be required at both gate-channel chokes in order to propagate the hotspots fully across the trunk of the device. At a second channel bias current value $I_{cn2}>I_{cn1}$, hotspot formation at one choke may be sufficient to "pinch" or crowd the current in the trunk to the extent that a critical current density across the truck is exceeded. In some implementations, a void 235 may be formed in the main channel between the two gate channels.

According to some embodiments, a multi-input OR gate 209 may be formed, as depicted in FIG. 2I. A multi-input OR gate may comprise a plurality of gate channels 212 and gate chokes 215 formed to intersect with a main channel along a trunk region 230. As may be appreciated, exceeding a critical current at any one of the gates can toggle the main channel from a superconducting state to an ohmic-conduction state. The multi-input OR gate 209 may be formed in a small area as a single device and from a single layer of superconducting material. The gate channels may be on the same side of the main channel as shown in some implementations, or may be distributed on both sides of the main channel. In some implementations, the width of the trunk 230 may modulate, so as to localize resistive plug formation near each gate junction and prevent a resistive plug at one gate overlapping onto a next gate.

A three-terminal device 207 may also be formed with a main channel having a substantially uniform width, as depicted in FIG. 2J. In such embodiments, the majority of the main channel may act as a trunk 230 in which a resistive plug is formed. A resistive plug may not be as localized near the intersection of the main channel and gate channel in a device having a main channel with a substantially uniform width.

III. Numerical Simulations

An operational aspect of the superconducting, three-terminal device is localized critical-current suppression, wherein a hotspot formed in the choke is sustained by Joule heating and suppresses the superconducting characteristics or critical current of the nearby material. Phonons and quasiparticles diffuse from the hotspot to the surrounding superconductor where they interact with the superconducting bath, depleting the local Cooper pair population as they relax back to equilibrium. (See, Rothwarf, A. and Taylor, B. N., "Measurement of recombination lifetimes in superconductors," *Phys. Rev. Lett.* 19, 27-30 (1967)) In the case of thin-film NbN, out-diffusion of hot electrons may be the primary means of thermal energy transfer from the hotspot to the surrounding material. (See, Prober, D. E. "Superconducting terahertz mixer using a transition-edge microbolometer," *Appl. Phys. Lett.* 62, 2119 (1993) and Annunziata, A. J. et al., "Reset dynamics and latching in niobium superconducting nanowire single-photon detectors," *J. Appl. Phys.* 108, 084507 (2010))

Numerical simulations were carried out to model and observe the dynamics of hotspot formation, critical current suppression, and formation of a resistive plug in the main channel of a superconducting, three-terminal device. The simulations used an established theoretical framework (a two-temperature model) which uses an effective electron temperature $T_e$ to represent the temperature of populations of quasiparticles and Cooper pairs. (See, e.g., Semenov, A., Nebosis, R., Gousev, Y., Heusinger, M. & Renk, K., "Analysis of the nonequilibrium photoresponse of superconducting films to pulsed radiation by use of a two-temperature model," *Phys. Rev. B* 52, 581-590 (1995).) The simulation used no free parameters, but instead employed measurements from a fabricated device as well as empirical parameters for thin-film NbN found in the literature. (See, Annunziata, A. J. et al., "Reset dynamics and latching in niobium superconducting nanowire single-photon detectors," *J. Appl. Phys.* 108, 084507 (2010) and Semenov, A. D., Gol'tsman, G. N. and Korneev, A. a., "Quantum detection by current carrying superconducting film," *Phys. C Supercond.* 351, 349-356 (2001).) The simulations were also used to corroborate experimental results and facilitate device designs.

Figure 7A:
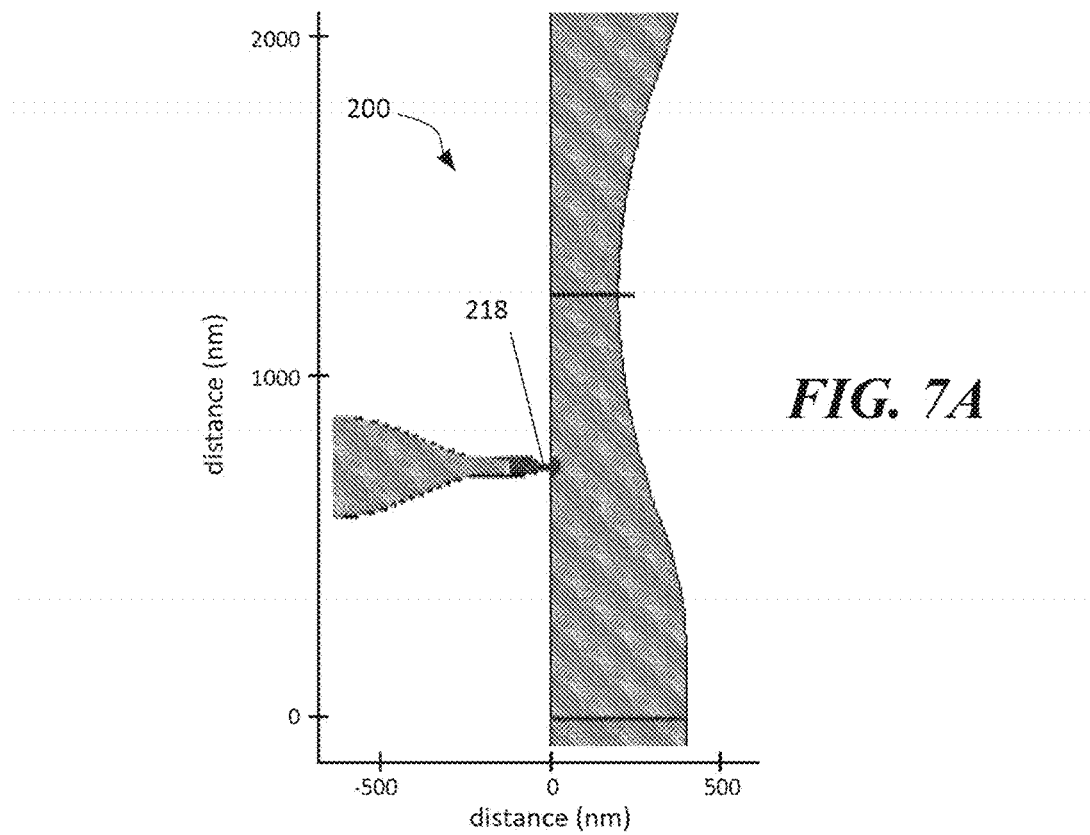
FIG. 7A depicts a superconducting, three-terminal device design used for a numerical simulation of device operation.
Figure 7B:
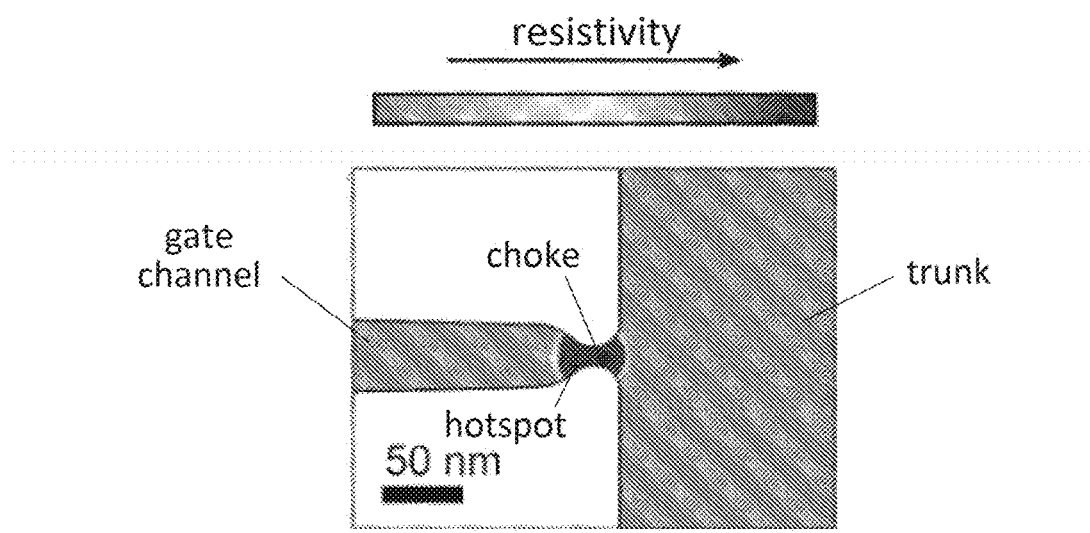
FIG. 7B shows a close-up view of a choke pattern used in numerical simulations, and shows the formation of a hotspot.

FIG. 7A depicts a pattern and dimensions of a three-terminal device 200 that was used for some simulations. The design incorporates gradual, smoothed geometries for the trunk region and gate channel. The smoothed corners may reduce the effects of current crowding in the device, that may otherwise occur at abrupt transitions. Current crowding can cause localized regions of the device to be closer to a critical current in that region, and therefore more susceptible to inadvertent transitions to an ohmic-conduction state due to noise pulses. For the device simulation, the trunk's narrowest width was approximately 200 nm, located about 500 nm upstream of the gate channel junction. The width of the trunk at the gate channel was approximately 250 nm. The width of the channel's choke (depicted more clearly in FIG. 7B) was approximately 12 nm. The narrowest width of the choke was located about 12 nm from a near edge of the trunk. For the simulation, the superconducting material was NbN having a thickness of approximately 10 nm.

Results from the simulations showed formation of a hotspot 218 at the choke when the current applied to the gate channel $I_g$ exceeded the critical current value $I_{cg}$ for the gate channel. The hotspot appears in FIG. 7B as the darkened area at the choke, and represents a region of increased resistance. The extent of the hotspot along the channel was about initially about three times the narrowest width of the choke. Once the hotspot formed in the choke of the gate channel, the effective electron temperature $T_e$ of the surrounding ~100 nm was observed to increase. This temperature increase corresponds to a decrease in the critical current density $J_{crit}$ over the same radius, effectively reducing the total channel critical current. As a result of the hotspot formation, $I_{ccn}$ was reduced by 28% of its original value, which closely matched an experimentally measured value of 30.5%. Additionally, when $I_g$ was biased just above $I_{cg}$, the resistance of the simulated gate hotspot was 823Ω, which was comparable to an experimentally measured resistance of 832 Ω.

Figure 7C:
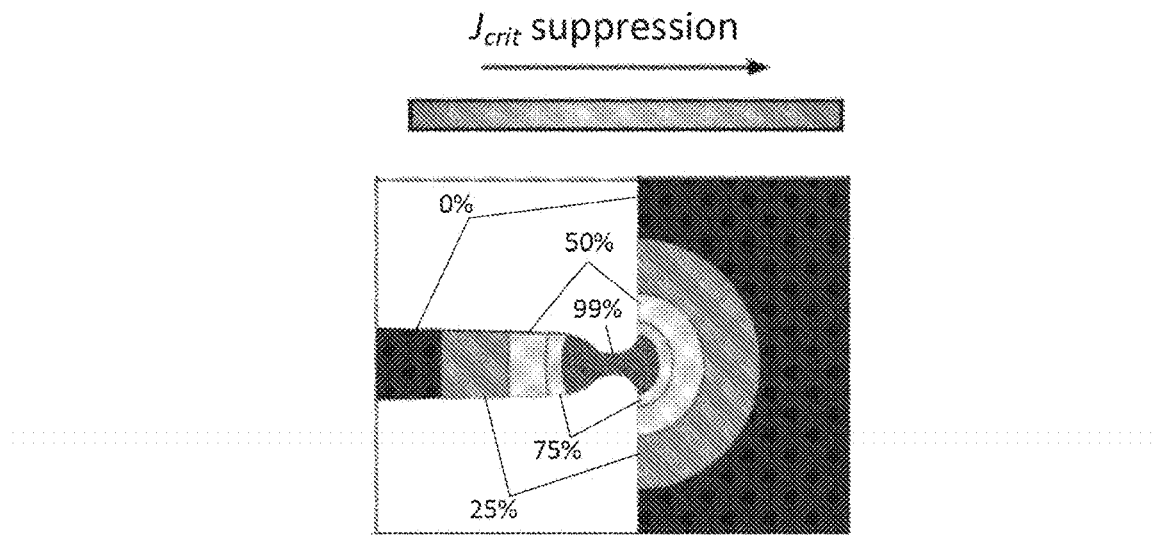
FIG. 7C; plots results from a simulation of critical current suppression near the choke of the device depicted in FIG. 7B for some embodiments.
Figure 7D:
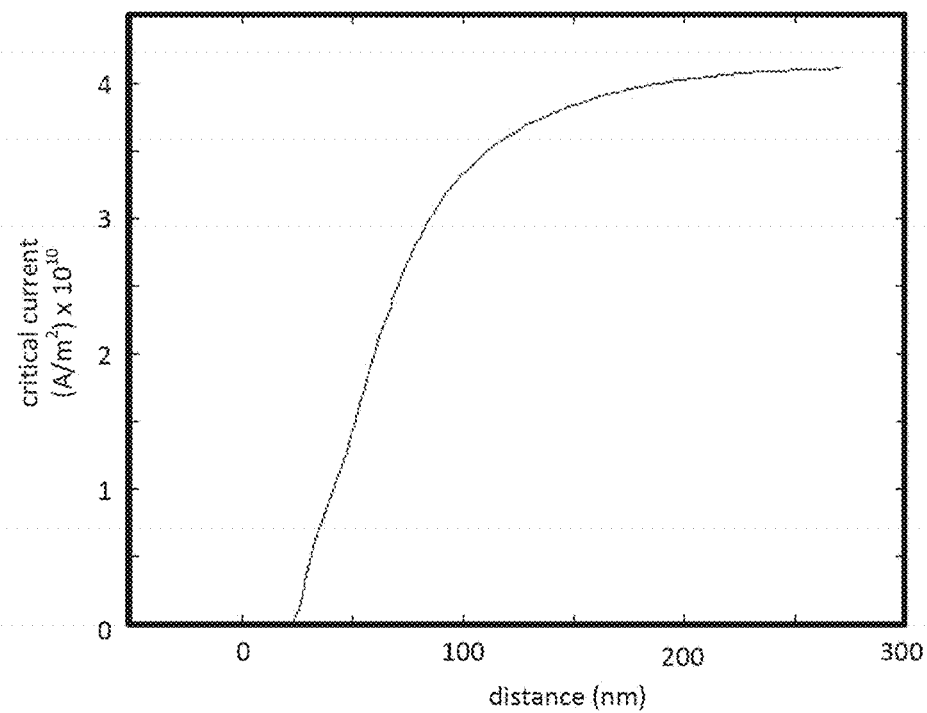
FIG. 7D depicts areal suppression of the superconducting critical current value in the vicinity of the hot spot of FIG. 7A.
Figure 7H:
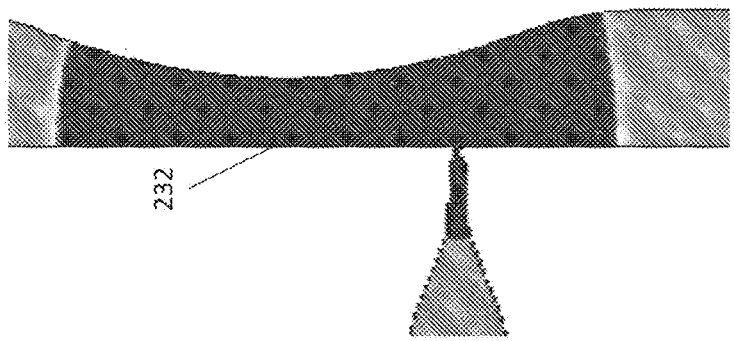
FIGS. 7E-7H depict time evolution of hot spot spreading and superconductivity quenching for the device depicted in FIG. 7A.
Figure 7G:
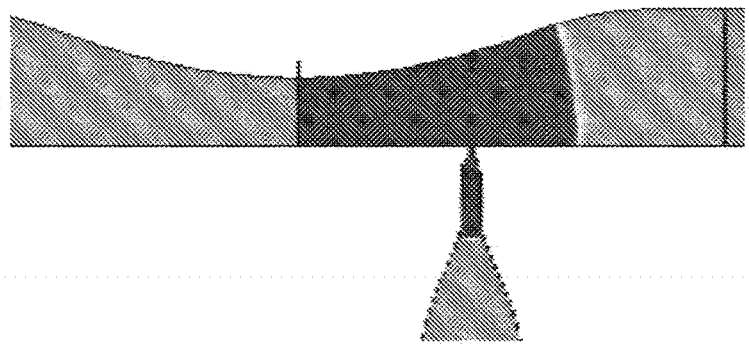
Figure 7F:
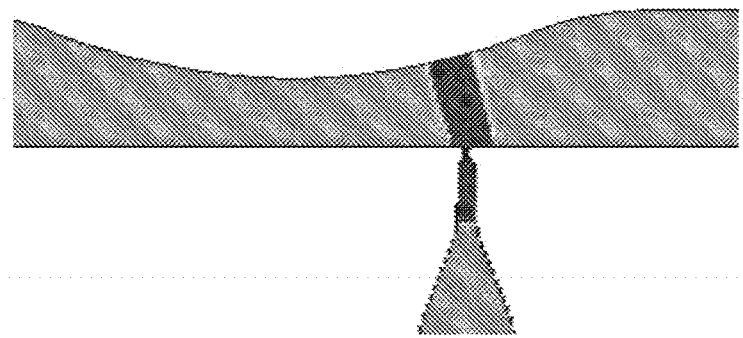
Figure 7E:
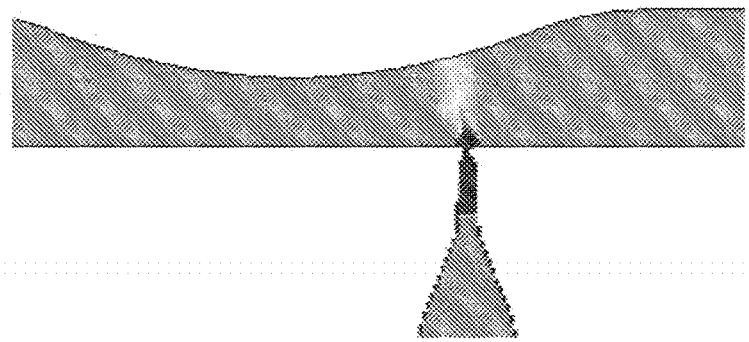

The effect of the hotspot on critical current density $J_{crit}$ is plotted in a contour graph of FIG. 7C, and is also shown in a two-dimensional plot of FIG. 7D. The shaded regions represent reductions of $J_{crit}$ by about 99%, 75%, 50%, 25%, and 0%, as labeled. The suppression of critical current extends into the trunk of the main channel, and is reduced sufficiently that the bias current triggers the formation of a resistive hotspot in the trunk.

FIGS. 7E-7H depict propagation of the hotspot across and along the trunk region of the device to form a stable resistive plug 232. The images depict resistivity in the gate and main channel at different points in time after formation of the hotspot at the choke. As can be seen from the simulation, the hotspot spreads from the choke, across the trunk, and along the main channel until a stable resistive plug is formed. The majority of the stabilized resistive plug forms upstream (toward the current input to the main channel) of the gate junction. The location of the resistive plug is influenced by at least the geometry of the trunk region and the location of the gate with respect to the trunk region. Locating the gate at a downstream portion of the trunk where the trunk expands to the channel reduces a downstream portion of the resistive plug with respect to the gate, and therefore reduces changes in gate input impedance between superconducting and ohmic-conduction states of the three-terminal device.

Superconducting, three-terminal devices may be used in various applications. In some embodiments, superconducting, three-terminal devices may be used as an amplifier or read-out device for superconducting detectors and sensors operated at cryogenic temperatures. According to some embodiments, superconducting, three-terminal devices may be used in photonic applications for detection of low light levels, e.g., single-photon detection. Such detectors may be used in bio-imaging applications. Superconducting, three-terminal devices may be used for other types of signal detection. For example, three-terminal devices may be connected to radio-frequency (RF) sensors, microwave sensors, or terahertz sensors. In some implementations, superconducting, three-terminal devices may be used in superconducting data processors or digital processers. In some embodiments, the devices may be used to drive digital memory or drive data or memory read-out at cryogenic temperatures. Superconducting, three-terminal devices may be used in place of SQUIDs in some embodiments, where large impedance loads need to be driven for example. In some implementations, superconducting, three-terminal devices may be connected to one or more SQUIDs for signal readout, amplification, and/or signal processing. Superconducting, three-terminal devices may also be connected to RSFQ systems for signal readout, amplification, and/or signal processing.

IV. Experiments

Several sets of experiments were carried out with superconducting, three-terminal devices that were fabricated via microfabrication processes described above. The dimensions of some devices were approximately the same as those used for the numerical simulations. An SEM image of one device that was fabricated in a batch of devices used in the experiments is shown FIG. 2B. The experiments were carried out at cryogenic temperatures.

Figure 8A:
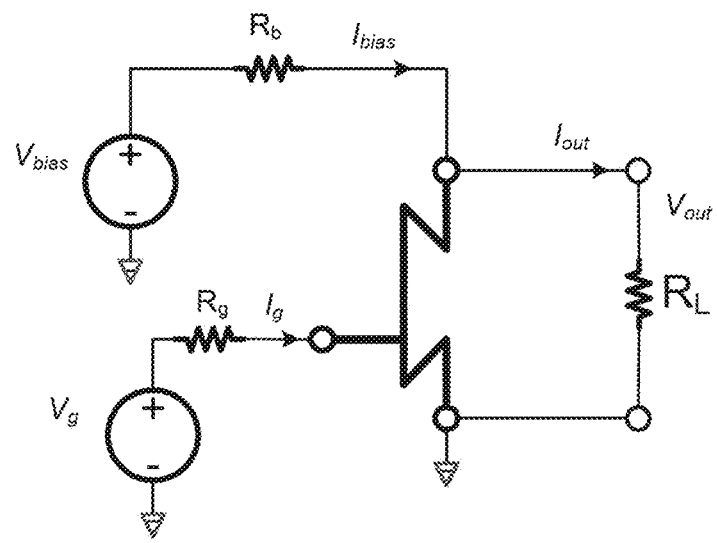
FIG. 8A depicts a circuit implementation of a superconducting voltage switch, according to some embodiments.

FIGS. 8A-8D depict circuit configurations and results from experiments that tested the switching characteristics of the superconducting, three-terminal devices. FIG. 8A depicts a configuration of a non-inverting amplifier that comprises a superconducting, three-terminal device, a first voltage source $V_{bias}$ connected to a channel bias resistor $R_b$, and a second voltage source $V_g$ connected to a gate bias resistor $R_g$. The first voltage source $V_{bias}$ and channel bias resistor $R_b$ provide a bias current $I_{bias}$ for the main channel. The second voltage source $V_g$ and gate bias resistor $R_g$ provide a signal current $I_g$ for the gate channel. A load $R_L$ of 500 ohms was placed at the output.

Figure 8B:
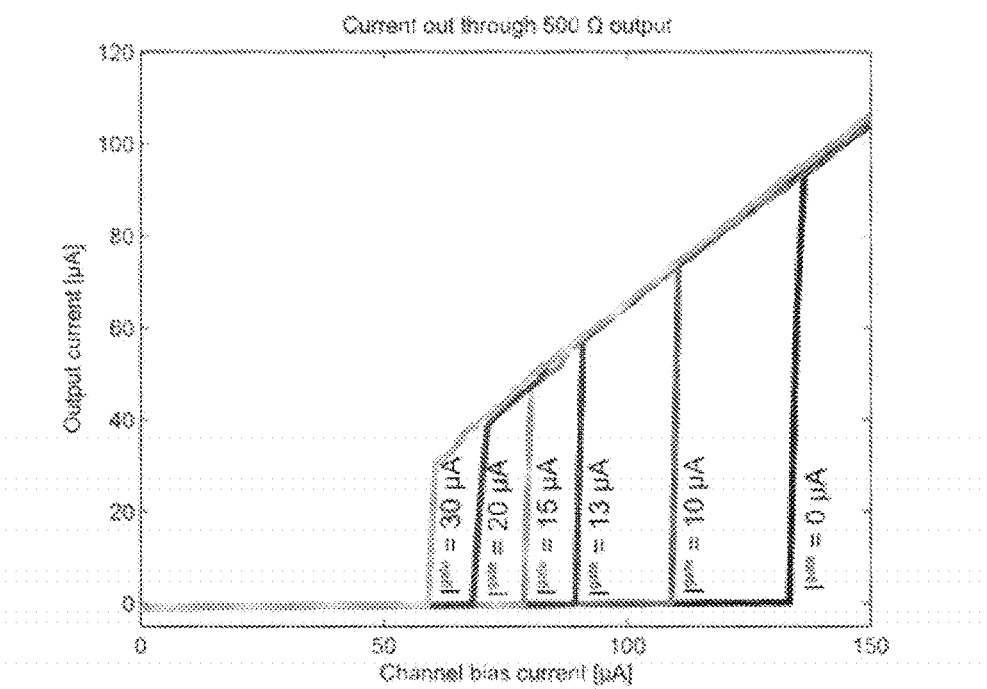
FIG. 8B illustrates measured switching behavior of the circuit of FIG. 8A.

Current switching characteristics are plotted in the graph of FIG. 8B. To generate this data, a fixed gate bias current was first applied to the three-terminal device in a superconducting state, and then a bias current was applied to the channel and increased. The output current $I_{out}$ was measured as the channel bias current was increased. The results show vertical transitions from a superconducting state to a ohmic-conduction regime when a resistive plug 232 forms in the trunk region of the device. For the case where the gate bias current is zero, switching occurs when the channel bias current exceeds a critical current for the channel ($I_{cn}>I_{ccn}$). For this device, the main channel critical current was about 130 microamps.

FIG. 8B indicates that current gain for the three-terminal device depends upon channel and gate bias value. With the channel biased at approximately 110 microamps, current in the main channel can be switched with a gate bias of about 10 microamps. The amount of current switched out of the channel and into a 500 ohm load is approximately 75 microamps, thus exhibiting a current gain of about 7.5.

Lower gains are obtained by reducing the main channel bias current, and higher gains may be obtained by biasing the main channel closer to its critical current. Operating a three-terminal device at lower gains improves its immunity to noise (e.g., immunity to noise-induced switching).

The use of a choke 215 in the gate region and the use of critical current suppression techniques allow the superconducting, three-terminal device 200 to be activated at lower gate bias currents (for a given channel bias current) than prior devices like that shown in FIG. 1. The use of the choke and critical current suppression enables high gain and improved noise immunity. As noted above in reference to FIG. 8B, gains greater than 7.5 are possible with the channel biased at about 80% of the trunk critical current. By comparison, a single-channel device like that shown in FIG. 1 exhibited a gain of about 2 with the channel biased at about 90% of its critical current. Improved noise immunity is exhibited, because the channel biasing is farther from a critical current of the trunk. For example, a larger noise pulse would be required to activate the three-terminal device 200 when the channel is biased at 80% of the trunk's critical current then in a device where the channel is biased at 90% of its critical current.

Figure 8C:
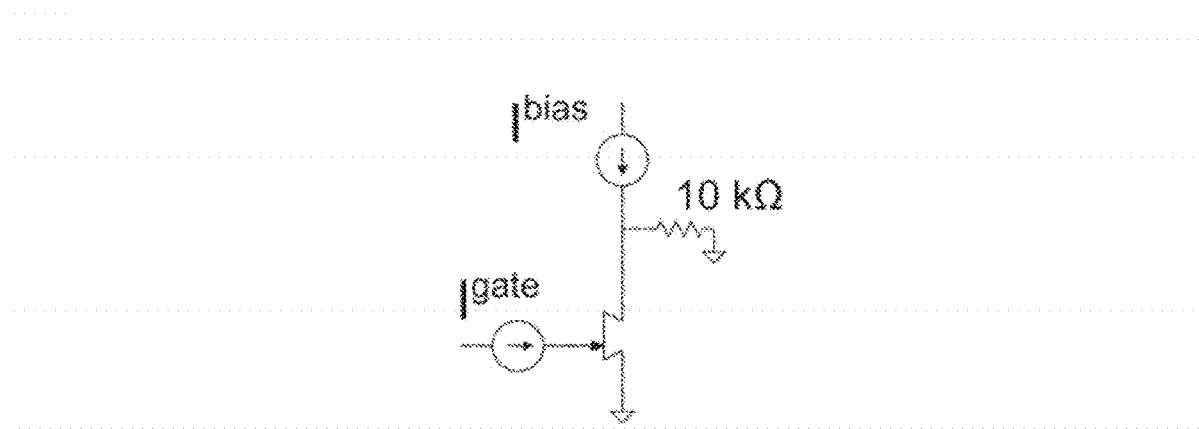
FIG. 8C depicts a another circuit implementation that includes a superconducting, three-terminal device.
Figure 8D:
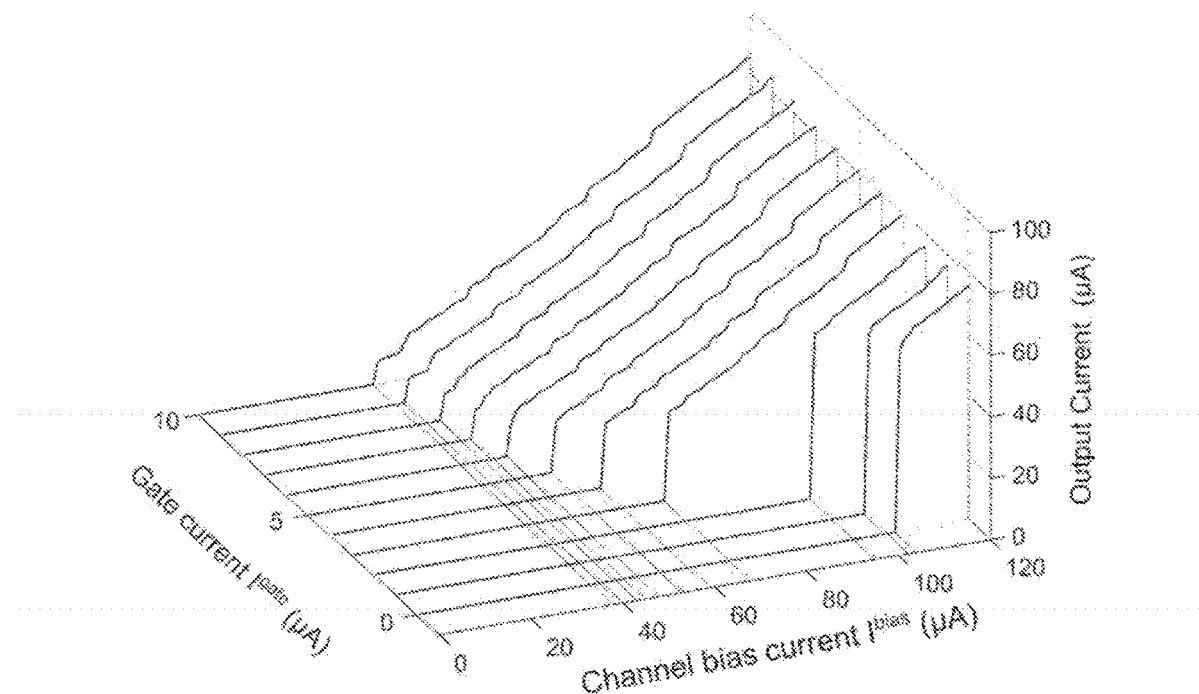
FIG. 8D is a 3D plot illustrating measured switching behavior of the circuit of FIG. 8C.

FIGS. 8C-8D depict a second COPY or non-inverting amplifier circuit and experimental results showing switching characteristics of a superconducting, three-terminal device. In this experiment, a resistive load of 10,000 ohms was used at the output of the three-terminal device, as indicated in FIG. 8C. Measurements were made in the same manner as for the previous experiment, but the results are plotted in the three-dimensional graph of FIG. 8D. The choke for this device was made smaller than for the device of FIG. 8A. As a result, higher current gains were achieved with this device.

For the device used in the experiments of FIGS. 8C-8D, a superconducting-to-resistive (S→R) phase transition is induced in a ~15-nm-wide choke by locally exceeding the critical current density $J_{crit}$ of the niobium nitride film. In turn, the resistive phase of the choke induces a nonlinear suppression of the critical current of the channel, $I_{ccn}$. FIG. 8D shows a dependence of channel critical current on gate current, $I_{ccn}(I_g)$. This dependence affects robust switching and gain of the three-terminal device. The form of $I_{ccn}(I_g)$ is suitable for a digital logic family. For example, nearly zero modulation of the channel critical current is observed until a gate-current threshold or gate critical current is reached ($I_{cg} \approx 2.9$ µA in this embodiment). Exceeding that threshold produces a 30.5±0.5% reduction in $I_{ccn}$ from a base value at zero gate current $I_{ccn0}$. For example, the main channel critical current decreases from about 95 µA to about 67 µA when the gate channel current is changed from about 2 µA to about 3 µA, whereas there is little change in the main channel critical current for changes in the gate channel current between 0 µA and about 2 µA. The reduction occurs coincidentally with a nonzero resistance measured at the gate terminal, indicating the formation of the resistive hotspot in the choke is responsible for the suppression of $I_{ccn}$. Main channel bias currents $\gtrsim 0.9$ $I_{ccn0}$ resulted in undesired switching behavior such as photon- and noise-induced hotspot generation, while operating the devices at lower bias currents improved their robustness to source noise and typical ambient magnetic noise.

In similar experiments, a three-terminal device was operated to provide a gain of ~20 and drive impedances of more than 100,000 ohms (100 kΩ). Digital operation was reproduced for load impedances of 50Ω, 100Ω, 1 kΩ, 10 kΩ, 100 kΩ, and an open-circuit case. In the open-circuit case, the bias condition of $I_{cn}$=0.85 $I_{ccn}$=90 µA yielded an output voltage of 8.1 V and an input-output isolation of 42.7kΩ. Three-terminal devices were operated at temperatures of 4.2K in typical ambient magnetic fields. The ambient magnetic fields had no noticeable effect on device operation.

Figure 9A:
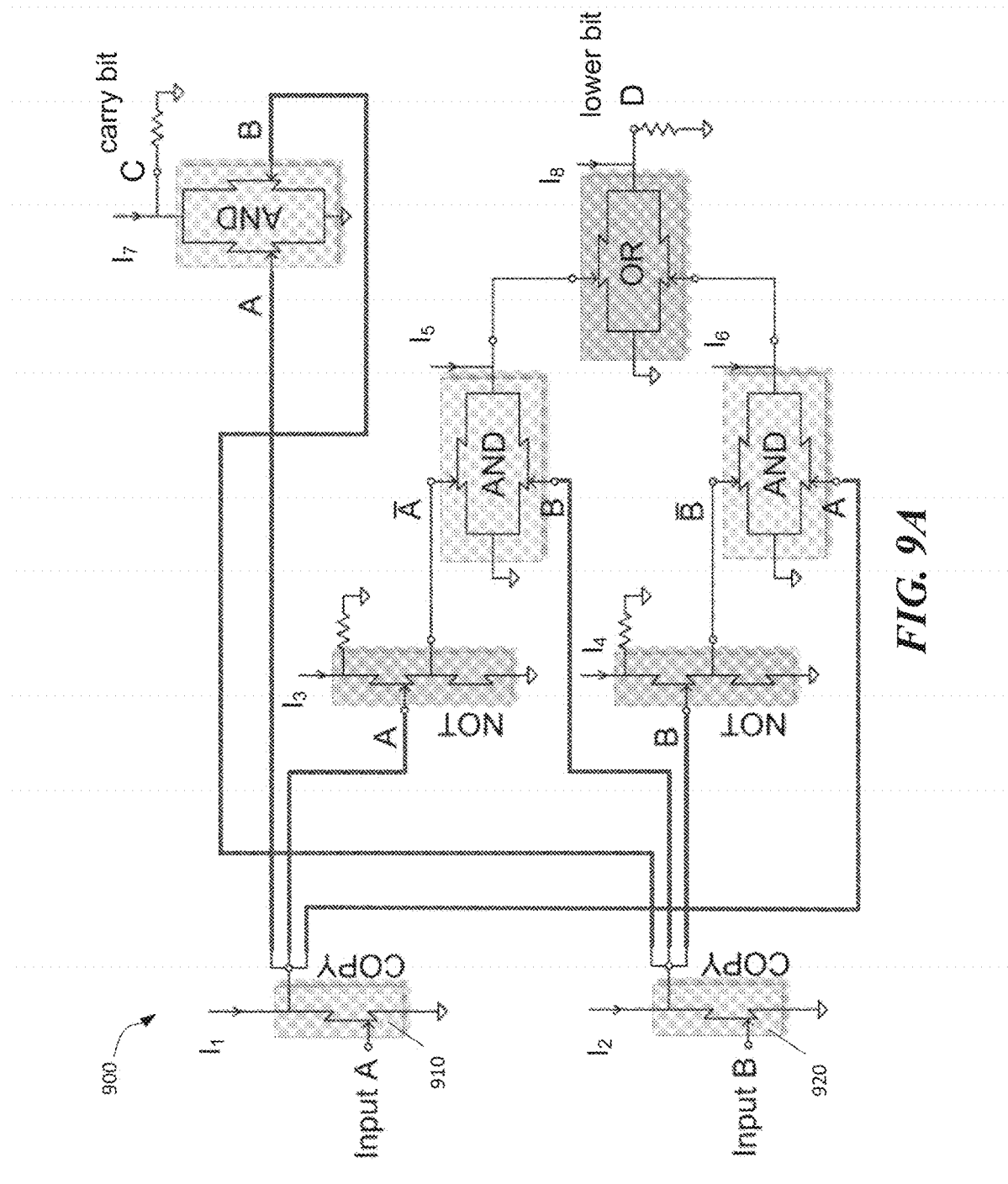

To demonstrate logic functionality, multiple logic elements were integrated onto a single substrate and configured as a half-adder circuit 900, as depicted in FIG. 9A. Input bits applied to inputs A and B are added, and the result provided as a two-bit output consisting of a lower bit and carry bit. Voltages recorded at the outputs C and D represent logic 1 and 0 states, in some embodiments. The various logic circuit elements are described above in connection with FIGS. 6A-6C.

The logic gates were biased in a pipelined manner after the application of signals to Input A and Input B to perform the summing computation. Valid inputs were translated into valid outputs for the next stage only upon the enabling of the gate bias current. After the computation was completed and the final outputs were recorded, all the input and bias currents $I_1$-$I_8$ were reduced to unlatch any latched gates and reset the computation. For the purposes of this demonstration, operating in the latching regime increased device tolerance to potentially large fabrication defects. In the latching regime, variations between the OFF-state input impedances of the gates did not matter, because each stage was able to drive arbitrarily large input impedances in the next stages. To operate in a non-latching regime, output impedances must be more carefully controlled.

Signal inputs were provided into the front-end COPY gates 910, 920, which acted as fan-out buffers to distribute the input signals A and B signals to other logic gates in the adder circuit. The prototyped adder circuit was tested at cryogenic temperatures as signals at various probe points or nodes in the circuit were recorded. No electrical or magnetic shielding of the half-adder was necessary.

A custom 16-channel combined ADC and DAC system was assembled to handle the multiple gate and bias inputs, and to read out their bias voltages. For the gate inputs and channel biases, current sources were approximated using the DAC voltage channels in series with 100 kΩ resistors. The ADC channels were used to record the status of each gate's output. Due to the pipeline-propagation of the half-adder, in combination with the low-rate DAC/ADC system, the computation of the half-adder outputs required approximately 0.8 seconds to complete. No external amplification was necessary for readout, and the lower bit and carry bit generated 38.8 mV and 17.0 mV respectively across their 330Ω load resistors. The sampling rate of the room-temperature electronics setup limited the computation rate to 1.2 Hz. In this mode, longer time scales present more opportunity for noise to erroneously switch the devices. Despite this disadvantage, after exercising the circuit over 4,000 cycles spanning 55 minutes, the circuit produced only seven errors.

Due to the pipeline-propagation of the half-adder, in combination with the low-rate DAC/ADC system, the computation of the half-adder outputs required approximately 0.8 seconds to complete. No external amplification was necessary for readout, and the lower bit and carry bit generated 38.8 mV and 17.0 mV respectively across their 330Ω load resistors. The sampling rate of the room-temperature electronics setup limited the computation rate to 1.2 Hz. In this mode, longer time scales present more opportunity for noise to erroneously switch the devices. Despite this disadvantage, after exercising the circuit over 4,000 cycles spanning 55 minutes, the circuit produced only seven errors.

The logic signals applied to Input A and Input B, and those measured at outputs C and D, are plotted in FIG. 9B. The lower bit and carry bit traces show per-channel output of the half-adder circuit for computation of 0+0, 0+1, 1+0, and 1+1 applied at Input A and Input B, repeated twice. The lower bit ($2^0$) and carry bit ($2^1$) correctly reflect the sum of signals at Input A and Input B. Because of time delays associated with reducing and applying bias currents $I_1$-$I_8$ to the main channels of the devices to remove latching between the application of different signal inputs, an electronics biasing delay $\tau_{bias}$ occurs prior to the read-out of the lower bit and carry bit. The overlay of ones and zeros corresponds to logic HIGH and LOW values.

FIG. 9C depicts an AND gate timing diagram for pipelined logic propagation. A same biasing scheme may be used for OR and NOT gates. Once gates A and B have valid inputs, the channel bias current is enabled and the resulting output can be used as an input for the next stage. $\tau_{bias}$ denotes a propagation delay due to the low-rate bias electronics. In some embodiments, the electronics biasing delay $\tau_{bias}$ may be reduced by reducing and applying all channel biases at the same time. In other embodiments, channel biases may be reduced and applied in a cascade or pipeline manner, as signals propagate through the circuit. Cascade biasing may reduce inadvertent switching of gates due to noise.

Another experiment (see FIGS. 10A-10C) was carried out to test amplification of short signal pulses as well as estimate an upper bound of pulse detection jitter. For this experiment, a superconducting, three-terminal device 1020 was integrated with a superconducting, nanowire, single-photon detector (SNSPD) 1010. Details of the SNSPD are described in Marsili, F. et al., "Detecting single infrared photons with 93% system efficiency," *Nat. Photonics* 7, 210-214 (2013), which is incorporated herein by reference. When detecting a photon, an SNSPD produces a millivolt-scale microwave pulse with sub-100-picosecond (ps) rising edges. The integrated three-terminal device 1020 received pulses produced by the SNSPD 1010 as input into its gate, and amplified the pulses at its output. The SNSPD and three-terminal device were monolithically fabricated from a same NbN film on a single substrate within a 100 μm² area, connecting the output of the SNSPD to the gate terminal of the superconducting, three-terminal device, as depicted in the circuit schematics of the integrated device in FIGS. 10A-10B.

Current biasing was accomplished through the use of inductive splitting, where the inductance was provided by the kinetic inductance of nanowires. The inductors were made by patterning long nanowires, which intrinsically produce kinetic inductance. The length of the inductor nanowires (and thus their total inductance) were scaled against the SNSPD, which had an approximate kinetic inductance of $L_k \approx 25$ nanoHenry (nH). The SNSPD nanowires had a width of about 60 nm, and the inductor nanowires had widths of about 200 nm. The 50Ω lines were high-frequency coaxial cable running between the sample and room-temperature electronics. During operation, the SNSPD was biased at 35 μA, and the three-terminal device at 95 μA.

Expected operation was ensured by measuring: photon sensitivity for the SNSPD and amplifier when biased separately; critical current suppression in the three-terminal device channel when the SNSPD was overbiased (creating a hotspot in the gate); count rate from both outputs when biased together; count rate vs. $I^{bias}$; and count rate from the SNSPD vs. $I^{SNSPD}$. The results of these measurements indicate that (1) the three-terminal device amplifier, at a bias of 95 μA, was not photosensitive; (2) there was a 1:1 correspondence in counts between the two outputs (one amplifier pulse per SNSPD pulse); (3) no counts were generated in the amplifier when only the SNPSD was biased, and vice-versa.

The room-temperature readout and bias electronics are depicted in FIG. 10B. Pulses generated from the integrated device were output to the 50Ω coaxial cables depicted in FIG. 10A, and arrived at the other end of the cables, depicted in FIG. 10B. The pulses were then amplified with three cascaded 20-3000 MHz amplifiers before being input to an oscilloscope.

The circuit design allowed separate biasing of each device, as well as simultaneous read out of the unamplified SNSPD pulses and amplified output pulses for comparison. When the SNSPD was illuminated with a 1550-nm-wavelength, sub-picosecond laser, output pulses were produced from both devices concurrently. Comparison of pulses output from the SNSPD (detected at port 1) and pulses output from the three-terminal device (detected at port 2) showed an increase in signal pulse amplitude of about 2.9. This increase in amplitude proportionally increased the slew rate of the rising edge, resulting in a reduced jitter when measured by an oscilloscope.

Figure 10C:
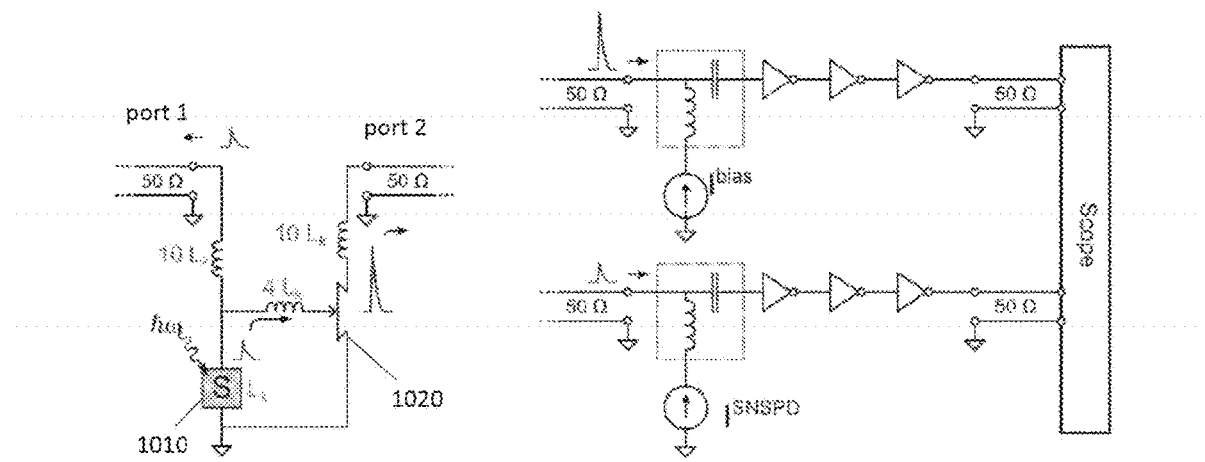
FIG. 10C shows measured signals for the circuit of FIGS. 10A-10B.
Figure 10C:
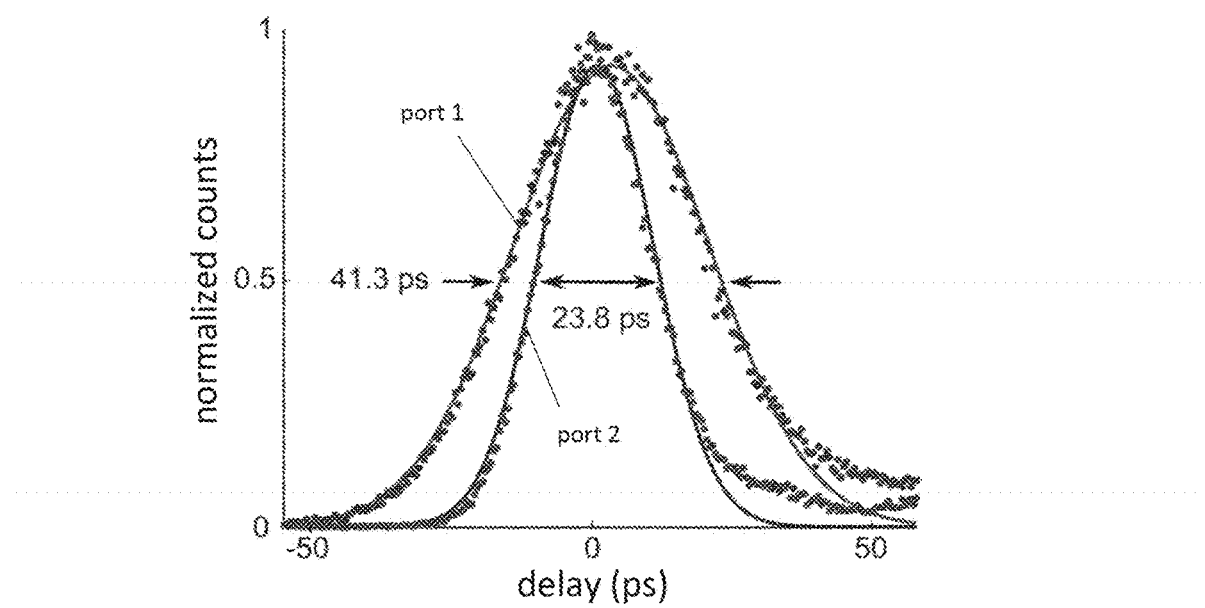

FIG. 10C plots a histogram of the relative delay between the laser sync edge and the resulting electrical pulse edges of the unamplified SNSPD pulses (detected from port 1) and amplified output (detected at port 2). Cabling delays have not been accounted for. Gaussian fits to each data set are shown as solid lines. Pulse jitter was measured between the sync edge of the sub-ps laser and the rising edge of each device's output pulses. The unamplified SNSPD pulses had a full-width half-max jitter of about 41.3±0.3 ps (as shown in FIG. 10C), while the corresponding amplified pulses from the three-terminal device showed a reduced full-width half-max jitter of about 23.8±0.2 ps. This value of about 23.8 ps represents an upper bound to the input-to-output jitter of the three-terminal device, and the actual value should be significantly smaller since state-of-the-art NbN SNSPDs alone produce jitters on the order of 20-40 ps. (See, Najafi, F., Marsili, F., Dauler, E., Molnar, R. J. and Berggren, K. K., "Timing performance of 30-nm-wide superconducting nanowire avalanche photodetectors," *Appl. Phys. Lett.* 100, 152602 (2012).)

Figure 11A:
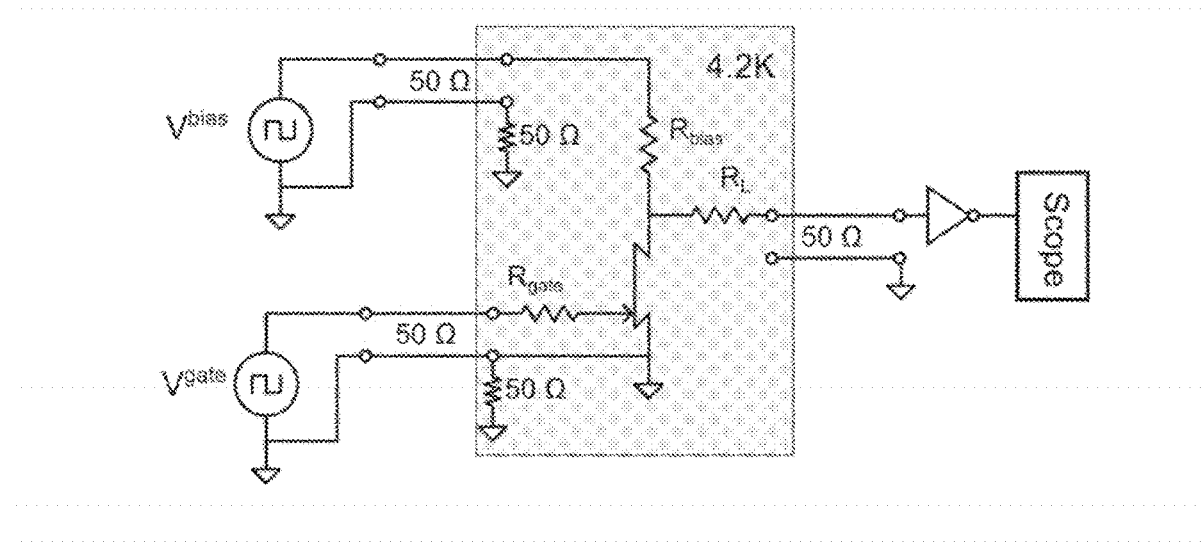
FIG. 11A represents a circuit used to evaluate high-speed switching, noise characteristics, and gate sensitivity of a superconducting, three-terminal device.

High-speed switching and noise performance of a three-terminal device was also studied in another experiment. FIG. 11A depicts a test circuit that was used to produce an eye diagram from a three-terminal device switched repetitively at a rate of 10 million cycles/second (10 MHz). The shaded area represents the portion of the circuit submerged in liquid helium at 4.2 K. Placing the resistors close to the device allowed conversion of the incoming voltage square waves to a low-amplitude current square waves. The resistors $R_L$, $R_{bias}$, and $R_{gate}$ were 1.46 kΩ, 20.8 kΩ, and 42.0 kΩ, respectively (as measured at 4.2 K).

Figure 11B:
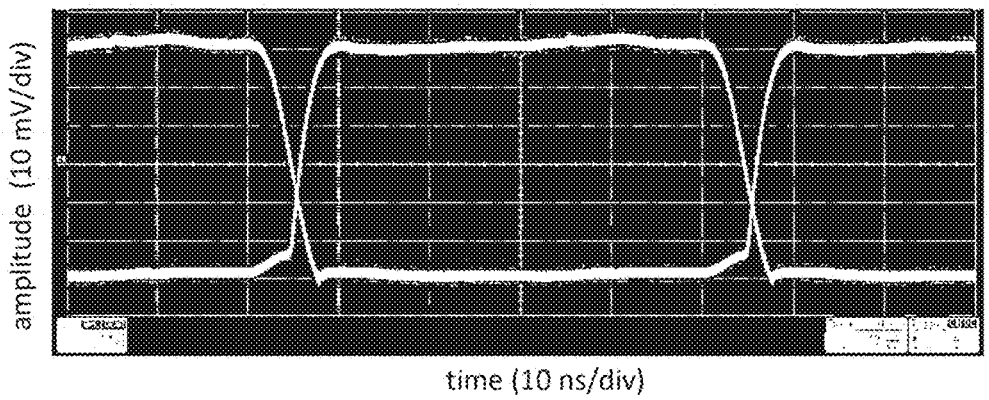
FIG. 11B is an eye diagram recorded from the experimental set-up depicted in FIG. 11A, according to some embodiments.

One bias-current, square-wave signal was applied to the device's main channel, and another current square-wave signal was applied to the gate port of the three-terminal device (delayed by approximately 10 ns relative to the main channel square-wave signal). The main channel bias signal primed the three-terminal device to switch from the ON to the OFF state, such that when the rising edge of the gate square-wave signal arrived, the three-terminal device switched, generating an output current which was read out by the scope. The resulting eye diagram is shown in FIG. 11B.

With a 1.46 kΩ output load, the three-terminal device was able to convert a 3.10±0.02 μA gate square-wave signal into a 62.7±1.2 μA output square wave, corresponding to a signal gain of 20.2. At the sampling point, the signal-to-noise ratio was measured to be 168. Applying a magnetic field perpendicular to the device plane, swept between ±7.4 mT, had no measureable impact to the eye diagram characteristics.

Figure 12:
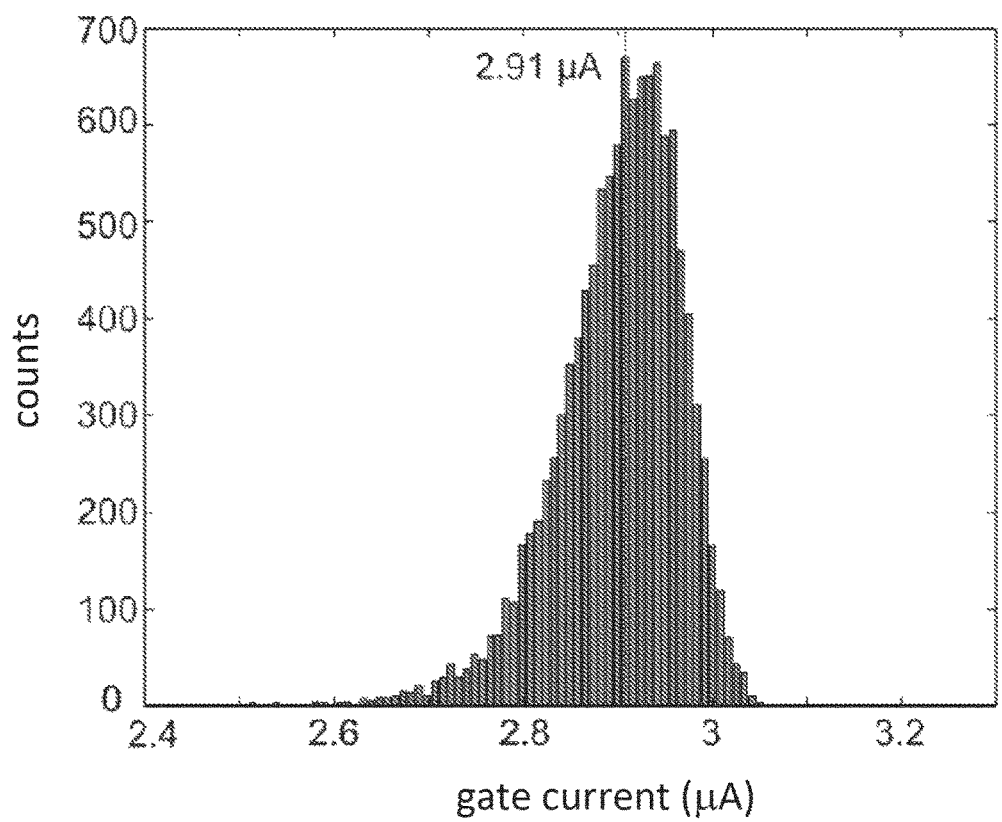
FIG. 12 is a histogram that represents gate sensitivity for switching a three-terminal device between superconducting and ohmic-conduction states, according to some embodiments.

An additional experiment was carried out to operate a superconducting, three-terminal device as a comparator to characterize the current sensitivity of the device's gate input. The experimental setup was the same as that used to evaluate high-speed switching and noise characteristics, and is depicted in FIG. 11A. However, for the gate sensitivity experiment, the current bias and readout scheme differed. In this experiment, a constant 52.8 µA bias current was applied to the main in order to prime it for transition from the superconducting state to the resistive state when the gate bias $I_g$ exceeded the critical current of the gate channel $I_{cg}$. The current input to the gate was then ramped (with a sawtooth wave) from 0 µA to 15 µA at a rate of 16.7 nA/µs, while the output current through the load resistor $R_L$ was recorded on a 1 GHz oscilloscope. The biasing was repeated 11,000 times (resetting the main channel to a superconducting state between runs). The gate switching current was recorded and plotted as a histogram in FIG. 12. From the histogram, we found a mode switching value of 2.91 µA with a 1-σ grey zone of 66 nA.

V. Conclusion

While the present teachings have been described in conjunction with various embodiments and examples, it is not intended that the present teachings be limited to such embodiments or examples. On the contrary, the present teachings encompass various alternatives, modifications, and equivalents, as will be appreciated by those of skill in the art.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, system upgrade, and/or method described herein. In addition, any combination of two or more such features, systems, and/or methods, if such features, systems, system upgrade, and/or methods are not mutually inconsistent, is included within the inventive scope of the present disclosure.

The terms "about," "approximately," and "substantially" may be used to refer to a value, and are intended to encompass the referenced value plus and minus variations that would be insubstantial. The amount of variation could be less than 5% in some embodiments, less than 10% in some embodiments, and yet less than 20% in some embodiments. In embodiments where an apparatus may function properly over a large range of values, e.g., one or more orders of magnitude, the amount of variation could be as much as a factor of two. For example, if an apparatus functions properly for a value ranging from 20 to 350, "approximately 80" may encompass values between 40 and 160.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The claims should not be read as limited to the described order or elements unless stated to that effect. It should be understood that various changes in form and detail may be made by one of ordinary skill in the art without departing from the spirit and scope of the appended claims. All embodiments that come within the spirit and scope of the following claims and equivalents thereto are claimed.

What is claimed is:

1. A three-terminal device comprising:
   a main channel connecting a first terminal and a second terminal;
   a gate channel connecting a control terminal to the main channel; and
   a low-resistance constriction formed in the gate channel between the control terminal and the main channel, wherein the constriction is configured to increase a gate current density proximal to the main channel and the constriction is located within approximately 200 nm of an edge of the main channel.

2. The three-terminal device of claim 1, wherein the main channel, gate channel, and constriction are patterned from a single layer of superconducting material.

3. The three-terminal device of claim 2, wherein the superconducting material comprises NbN, YBaCuO, HgTl-BaCaCuO, MgB$_2$, BISCCO, Nb, NbTiN, NbCN, Al, AlN, WSi, Ga, In, Sn, Pb, or MoGe.

4. A three-terminal device comprising:
   a main channel connecting a first terminal and a second terminal;
   a gate channel connecting a control terminal to the main channel; and
   a low-resistance constriction formed in the gate channel between the control terminal and the main channel, wherein the constriction is configured to increase a gate current density proximal to the main channel, wherein the constriction is located within approximately two diffusion lengths of a far edge of the main channel at an intersection with the gate channel, wherein one diffusion length $L_D$ is given by the following expression $$L_D = \sqrt{D_e \tau_r}$$

where $D_e$ is the diffusion constant for electrons in a superconducting material from which the gate channel is formed and $\tau_r$ is the recombination time for hot electrons in the superconducting material in a superconducting state.

5. The three-terminal device of claim 1, wherein the main channel further comprises a narrowed portion extending for a length along the main channel and an intersection of the gate channel with the main channel occurs within the length of the narrowed portion.

6. The three-terminal device of claim 1, wherein the main channel further comprises a narrowed portion extending for a length along the main channel and an intersection of the gate channel with the main channel occurs within the length of the narrowed portion and wherein a width of the narrowed portion is less than approximately three diffusion lengths, wherein one diffusion length $L_D$ is given by the following expression $$L_D = \sqrt{D_e \tau_r}$$

where $D_e$ is the diffusion constant for electrons in a superconducting material from which the gate channel is formed and $\tau_r$ is the recombination time for hot electrons in the superconducting material in a superconducting state.

7. The three-terminal device of claim 5, wherein the intersection is located within a downstream half of the length of the narrowed portion.

8. A three-terminal device comprising:
   a main channel connecting a first terminal and a second terminal;
   a gate channel connecting a control terminal to the main channel;
   a low-resistance constriction formed in the gate channel between the control terminal and the main channel, wherein the constriction is configured to increase a gate current density proximal to the main channel; and
   periodic width modulations formed in the main channel and located near a junction of the gate channel with the main channel.

9. The three-terminal device of claim 1, further comprising:
   an output terminal connected to the first terminal; and
   a resistor connected in series with the output terminal.

10. The three-terminal device of claim 9, wherein a resistance of the resistor is any value up to 200,000 ohms.

11. The three-terminal device of claim 9, further comprising a sensor connected to the control terminal and configured to provide a signal representative of a sensed physical parameter to the control terminal.

12. The three-terminal device of claim 11, wherein the sensor comprises a superconducting single-photon detector.

13. The three-terminal device of claim 11, wherein the sensor comprises a radio frequency, microwave, or terahertz sensor.

14. The three-terminal device of claim 9, further comprising a SQUID having its output terminal connected to the control terminal.

15. The three-terminal device of claim 9, connected in a circuit comprising an RSFQ system, wherein the three-terminal device is configured to receive a signal from the RSFQ system.

16. A method of operating a three-terminal device fabricated from a superconducting material, the method comprising:
   placing the three-terminal device in a superconducting state, such that a main channel between a first terminal and a second terminal is superconducting;
   applying a control signal to a constriction in a gate channel that connects a control input to the main channel, such that current at the constriction exceeds a superconducting critical current level at the constriction;
   propagating a normal-conduction hotspot that suppresses a superconducting critical current value from the constriction to the main channel; and
   forming a stable resistive plug in the main channel.

17. The method of claim 16, further comprising diverting current from the main channel to an output terminal that is connected to the first terminal.

18. The method of claim 17, further comprising driving a load connected to the output terminal, wherein the load has a resistance value up to 200,000 Ohms.

19. The method of claim 16, wherein the hotspot is propagated to a narrowed portion of the main channel, the narrowed portion extending a length along the main channel.

20. The method of claim 19, wherein an intersection of the gate channel and main channel is located within a downstream half of the length of the narrowed portion of the main channel.

21. The method of claim 16, further comprising:
   applying a bias current to the main channel; and
   receiving an output signal from the first terminal.

22. The method of claim 21, further comprising receiving the control signal from a sensor that is connected to the gate channel.

23. The method of claim 16, wherein the main channel, gate channel, and constriction are formed from a single layer of superconducting material.

24. A multi-input OR gate comprising:
- a main channel connecting a first terminal and a second terminal;
- at least two gate channels connecting at least two control terminals to the main channel; and
- at least two low-resistance constrictions formed in the at least two gate channels between the at least two control terminals and the main channel, wherein each constriction is configured to increase a gate current density proximal to the main channel, wherein the constrictions are located within approximately two diffusion lengths of a far edge of the main channel at each intersection with each gate channel, wherein one diffusion length $L_D$ is given by the following expression $$L_D = \sqrt{D_e \tau_r}$$

where $D_e$ is the diffusion constant for electrons in a superconducting material from which the gate channel is formed and $\tau_r$ is the recombination time for hot electrons in the superconducting material in a superconducting state.

25. The OR gate of claim 24, wherein the main channel, gate channels, and constrictions are patterned from a single layer of superconducting material.

* * * * *